US010541687B2

United States Patent
Kakaiya et al.

(10) Patent No.: US 10,541,687 B2
(45) Date of Patent: *Jan. 21, 2020

(54) VALIDATING AN IMAGE FOR A RECONFIGURABLE DEVICE

(71) Applicant: Intel Corporation, Santa Clara, CA (US)

(72) Inventors: Utkarsh Y. Kakaiya, Folsom, CA (US); Joshua D. Fender, East York (CA)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/942,919

(22) Filed: Apr. 2, 2018

(65) Prior Publication Data

US 2019/0109593 A1  Apr. 11, 2019

Related U.S. Application Data

(63) Continuation of application No. 15/628,888, filed on Jun. 21, 2017, now Pat. No. 9,935,638.

(51) Int. Cl.
*G06F 7/38* (2006.01)
*H03K 19/173* (2006.01)

(52) U.S. Cl.
CPC . *H03K 19/17768* (2013.01); *H03K 19/17728* (2013.01); *H03K 19/17764* (2013.01)

(58) Field of Classification Search
None
See application file for complete search history.

(56) References Cited

U.S. PATENT DOCUMENTS

| 6,904,527 B1 * | 6/2005 | Parlour | G06F 21/76 713/100 |
| 7,987,373 B2 * | 7/2011 | McElvain | G06F 21/76 326/101 |
| 9,935,638 B1 * | 4/2018 | Kakaiya | H03K 19/17768 |

* cited by examiner

*Primary Examiner* — Anh Q Tran
(74) *Attorney, Agent, or Firm* — Trop, Pruner & Hu, P.C.

(57) ABSTRACT

A device includes a reconfigurable circuit and reconfiguration logic. The reconfiguration logic is to: receive, via a policy interface, a user policy and an image policy; receive a first reconfiguration image via a first configuration interface of a plurality of configuration interfaces; validate the first configuration interface based on the user policy; validate the first reconfiguration image based on the image policy; and in response to a determination that the first configuration interface and the first reconfiguration image are both valid, reconfigure the reconfigurable circuit using the first reconfiguration image.

22 Claims, 23 Drawing Sheets

VALIDATING AN IMAGE FOR A RECONFIGURABLE DEVICE

CLAIM OF PRIORITY

This application is a continuation of U.S. patent application Ser. No. 15/628,888, filed Jun. 21, 2017 and entitled "Validating an Image for a Reconfigurable Device". The content of the above application is hereby incorporated by reference.

FIELD OF INVENTION

Embodiments relate to reconfigurable devices.

BACKGROUND

Some integrated circuits may be designed to be configured by a user after manufacturing. For example, a field-programmable gate array (FPGA) may include an array of programmable logic elements that can be interconnected in different configurations. By changing such interconnections, the FPGA can be configured to perform different processing tasks (e.g., digital signal processing, video animation, packet processing, etc.).

DETAILED DESCRIPTION

Some datacenters may share computing resources with multiple clients. For example, a cloud service provider may allow multiple clients to share the storage and computing resources of a single server. Such computing resources may include reconfigurable circuits. As used herein, "reconfigurable circuit" refers to a circuit in which interconnections between logic elements can be reconfigured according to a data specification or "image." For example, one type of reconfigurable circuit is a field-programmable gate array (FPGA). However, sharing of a reconfigurable circuit can result in potential harm to data and hardware. For example, a malicious user could reconfigure a FPGA to steal sensitive data from other users of the datacenter. In another example, the FPGA could be reconfigured to perform repetitive tasks until an overheating event occurs, thereby resulting in damage to hardware resources.

In accordance with one or more embodiments, a reconfigurable device may be associated with a user policy and an image policy. The user policy may define a user entity and/or a configuration interface that is permitted to provide reconfiguration images for the device. The image policy may define valid reconfiguration images for the device. In some embodiments, reconfiguration logic may use the user policy and the image policy to control reconfigurations of the device. Accordingly, the risk of harm associated with the reconfigurable device may be reduced. Further, in some embodiments, the reconfiguration logic may provide virtualized reconfiguration of the device. As used herein, the term "virtualized reconfiguration" refers to reconfiguration using a layer of abstraction between the reconfigurable device and multiple user entities, such that each user entity can separately and securely reconfigure the same device. Examples of some embodiments are described below with reference to FIGS. 17-20.

Figure 1:
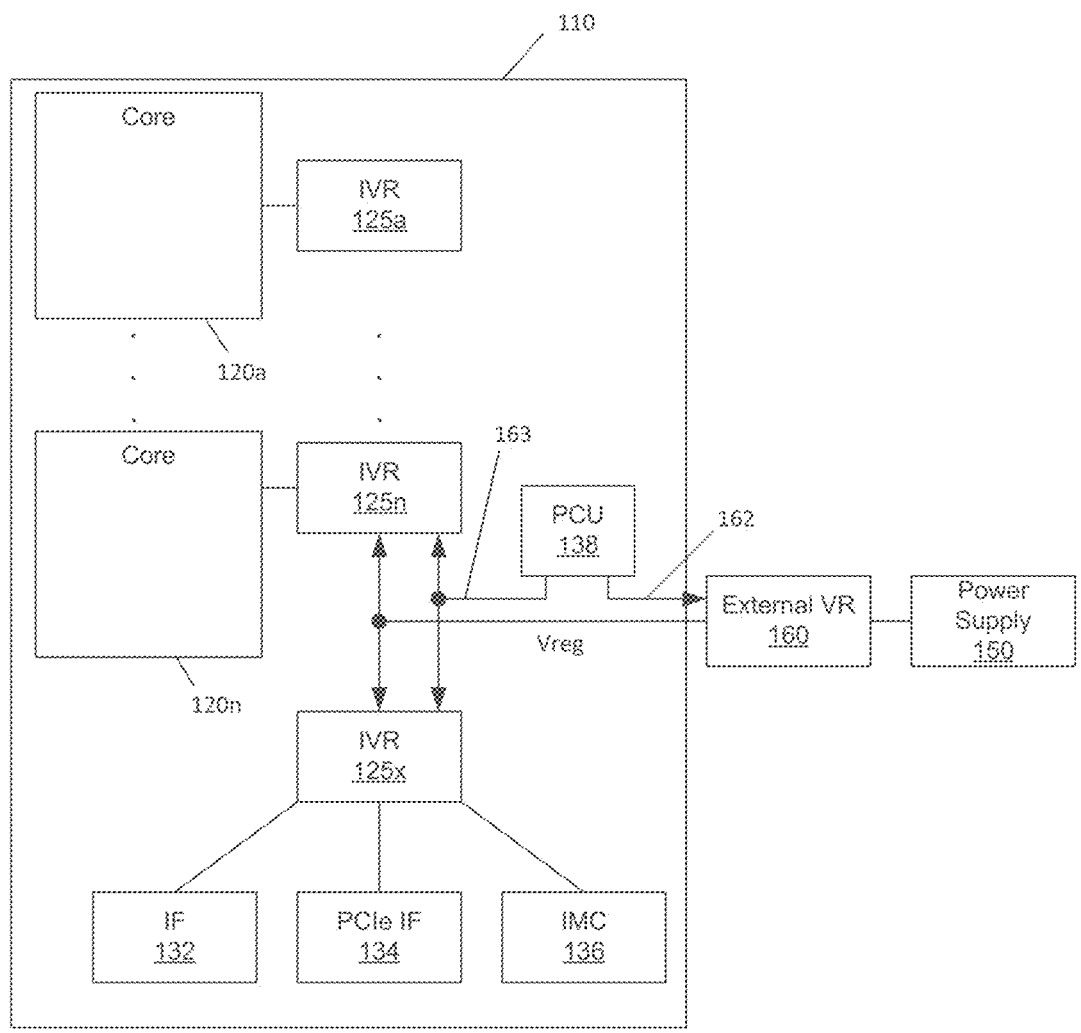
FIG. 1 is a block diagram of a portion of a system in accordance with an embodiment of the present invention.

Referring now to FIG. 1, shown is a block diagram of a portion of a system in accordance with an embodiment of the present invention. As shown in FIG. 1, system 100 may include various components, including a processor 110 which as shown is a multicore processor. Processor 110 may be coupled to a power supply 150 via an external voltage regulator 160, which may perform a first voltage conversion to provide a primary regulated voltage Vreg to processor 110.

As seen, processor 110 may be a single die processor including multiple cores 120a-120n. In addition, each core may be associated with an integrated voltage regulator (IVR) 125a-125n which receives the primary regulated voltage and generates an operating voltage to be provided to one or more agents of the processor associated with the IVR. Accordingly, an IVR implementation may be provided to allow for fine-grained control of voltage and thus power and performance of each individual core. As such, each core can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. During power management, a given power plane of one IVR may be powered down or off when the processor is placed into a certain low power state, while another power plane of another IVR remains active, or fully powered. Similarly, cores 120 may include or be associated with independent clock generation circuitry such as one or more phase lock loops (PLLs) to control operating frequency of each core 120 independently.

Still referring to FIG. 1, additional components may be present within the processor including an input/output interface (IF) 132, another interface 134, and an integrated memory controller (IMC) 136. As seen, each of these components may be powered by another integrated voltage regulator 125$_x$. In one embodiment, interface 132 may enable operation for an Intel® Quick Path Interconnect (QPI) interconnect, which provides for point-to-point (PtP) links in a cache coherent protocol that includes multiple layers including a physical layer, a link layer and a protocol layer. In turn, interface 134 may communicate via a Peripheral Component Interconnect Express (PCIe™) protocol.

Also shown is a power control unit (PCU) 138, which may include circuitry including hardware, software and/or firmware to perform power management operations with regard to processor 110. As seen, PCU 138 provides control information to external voltage regulator 160 via a digital interface 162 to cause the voltage regulator to generate the appropriate regulated voltage. PCU 138 also provides control information to IVRs 125 via another digital interface 163 to control the operating voltage generated (or to cause a corresponding IVR to be disabled in a low power mode). In various embodiments, PCU 138 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software).

In FIG. 1, PCU 138 is illustrated as being present as a separate logic of the processor. In other cases, PCU 138 may execute on a given one or more of cores 120. In some cases, PCU 138 may be implemented as a microcontroller (dedicated or general-purpose) or other control logic configured to execute its own dedicated power management code, sometimes referred to as P-code. In yet other embodiments, power management operations to be performed by PCU 138 may be implemented externally to a processor, such as by way of a separate power management integrated circuit (PMIC) or another component external to the processor. In yet other embodiments, power management operations to be performed by PCU 138 may be implemented within BIOS or other system software.

Although not shown in FIG. 1, in some embodiments, the processor 110 and/or a core 120 may include all or part of the reconfiguration logic described below with reference to FIGS. 17-20.

Embodiments may be particularly suitable for a multicore processor in which each of multiple cores can operate at an independent voltage and frequency point. As used herein the term "domain" is used to mean a collection of hardware and/or logic that operates at the same voltage and frequency point. In addition, a multicore processor can further include other non-core processing engines such as fixed function units, graphics engines, and so forth. Such processor can include independent domains other than the cores, such as one or more domains associated with a graphics engine (referred to herein as a graphics domain) and one or more domains associated with non-core circuitry, referred to herein as an uncore or a system agent. Although many implementations of a multi-domain processor can be formed on a single semiconductor die, other implementations can be realized by a multi-chip package in which different domains can be present on different semiconductor die of a single package.

While not shown for ease of illustration, understand that additional components may be present within processor 110 such as uncore logic, and other components such as internal memories, e.g., one or more levels of a cache memory hierarchy and so forth. Furthermore, while shown in the implementation of FIG. 1 with an integrated voltage regulator, embodiments are not so limited. For example, other regulated voltages may be provided to on-chip resources from external voltage regulator 160 or one or more additional external sources of regulated voltages.

Note that the power management techniques described herein may be independent of and complementary to an operating system (OS)-based power management (OSPM) mechanism. According to one example OSPM technique, a processor can operate at various performance states or levels, so-called P-states, namely from P0 to PN. In general, the P1 performance state may correspond to the highest guaranteed performance state that can be requested by an OS. In addition to this P1 state, the OS can further request a higher performance state, namely a P0 state. This P0 state may thus be an opportunistic, overclocking, or turbo mode state in which, when power and/or thermal budget is available, processor hardware can configure the processor or at least portions thereof to operate at a higher than guaranteed frequency. In many implementations, a processor can include multiple so-called bin frequencies above the P1 guaranteed maximum frequency, exceeding to a maximum peak frequency of the particular processor, as fused or otherwise written into the processor during manufacture. In addition, according to one OSPM mechanism, a processor can operate at various power states or levels. With regard to power states, an OSPM mechanism may specify different power consumption states, generally referred to as C-states, C0, C1 to Cn states. When a core is active, it runs at a C0 state, and when the core is idle it may be placed in a core low power state, also called a core non-zero C-state (e.g., C1-C6 states), with each C-state being at a lower power consumption level (such that C6 is a deeper low power state than C1, and so forth).

Understand that many different types of power management techniques may be used individually or in combination in different embodiments. As representative examples, a power controller may control the processor to be power managed by some form of dynamic voltage frequency scaling (DVFS) in which an operating voltage and/or operating frequency of one or more cores or other processor logic may be dynamically controlled to reduce power consumption in certain situations. In an example, DVFS may be performed using Enhanced Intel SpeedStep™ technology available from Intel Corporation, Santa Clara, Calif., to provide optimal performance at a lowest power consumption level. In another example, DVFS may be performed using Intel TurboBoost™ technology to enable one or more cores or other compute engines to operate at a higher than guaranteed operating frequency based on conditions (e.g., workload and availability).

Another power management technique that may be used in certain examples is dynamic swapping of workloads between different compute engines. For example, the processor may include asymmetric cores or other processing engines that operate at different power consumption levels, such that in a power constrained situation, one or more workloads can be dynamically switched to execute on a lower power core or other compute engine. Another exemplary power management technique is hardware duty cycling (HDC), which may cause cores and/or other compute engines to be periodically enabled and disabled according to a duty cycle, such that one or more cores may be made inactive during an inactive period of the duty cycle and made active during an active period of the duty cycle.

Power management techniques also may be used when constraints exist in an operating environment. For example, when a power and/or thermal constraint is encountered, power may be reduced by reducing operating frequency and/or voltage. Other power management techniques include throttling instruction execution rate or limiting scheduling of instructions. Still further, it is possible for instructions of a given instruction set architecture to include express or implicit direction as to power management operations. Although described with these particular examples, understand that many other power management techniques may be used in particular embodiments.

Figure 2:
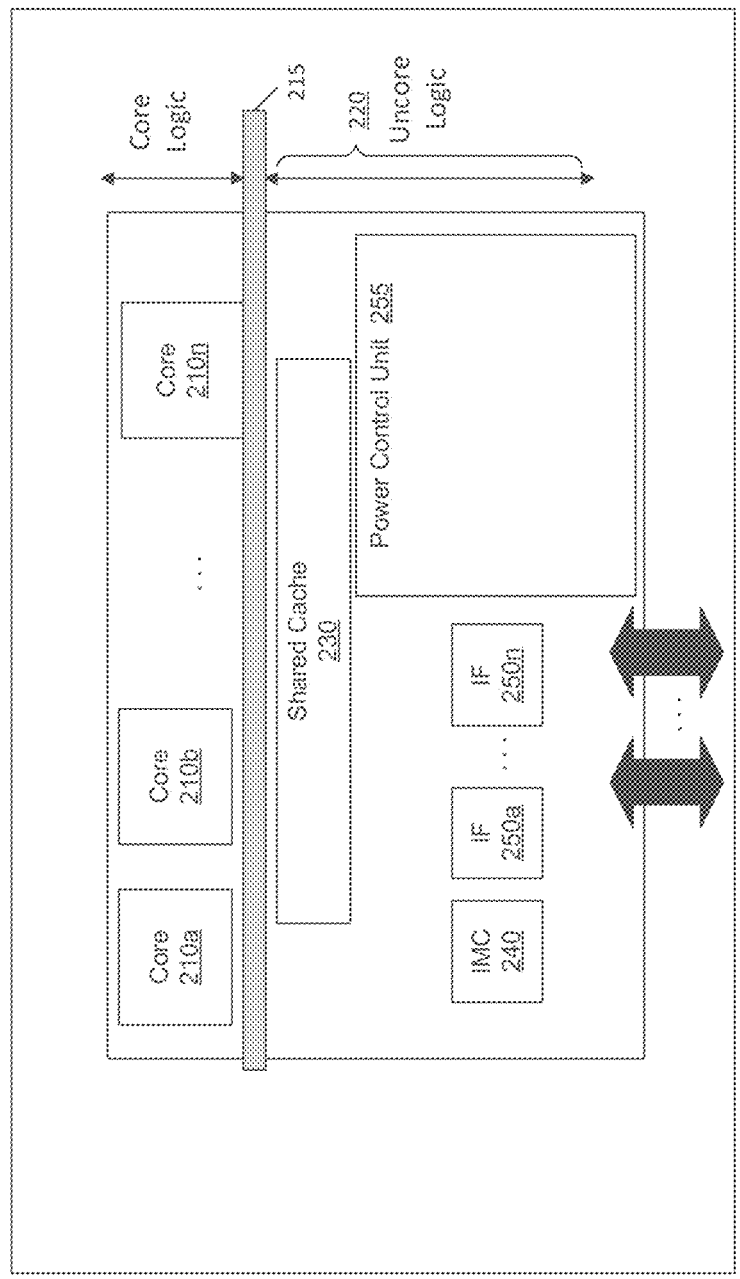
FIG. 2 is a block diagram of a processor in accordance with an embodiment of the present invention.

Embodiments can be implemented in processors for various markets including server processors, desktop processors, mobile processors and so forth. Referring now to FIG. 2, shown is a block diagram of a processor in accordance with an embodiment of the present invention. As shown in FIG. 2, processor 200 may be a multicore processor including a plurality of cores $210_a$-$210_n$. In one embodiment, each such core may be of an independent power domain and can be configured to enter and exit active states and/or maximum performance states based on workload. One or more cores 210 may be heterogeneous to the other cores, e.g., having different micro-architectures, instruction set architectures, pipeline depths, power and performance capabilities. The various cores may be coupled via an interconnect 215 to a system agent or uncore 220 that includes various components. As seen, the uncore 220 may include a shared cache 230 which may be a last level cache. In addition, the uncore may include an integrated memory controller 240 to communicate with a system memory (not shown in FIG. 2), e.g., via a memory bus. Uncore 220 also includes various interfaces 250 and a power control unit 255, which may include logic to perform the power management techniques described herein.

In addition, by interfaces 250a-250n, connection can be made to various off-chip components such as peripheral devices, mass storage and so forth. While shown with this particular implementation in the embodiment of FIG. 2, the scope of the present invention is not limited in this regard.

Although not shown in FIG. 2, in some embodiments, the processor 200 may include all or part of the reconfiguration logic described below with reference to FIGS. 17-20.

Figure 3:
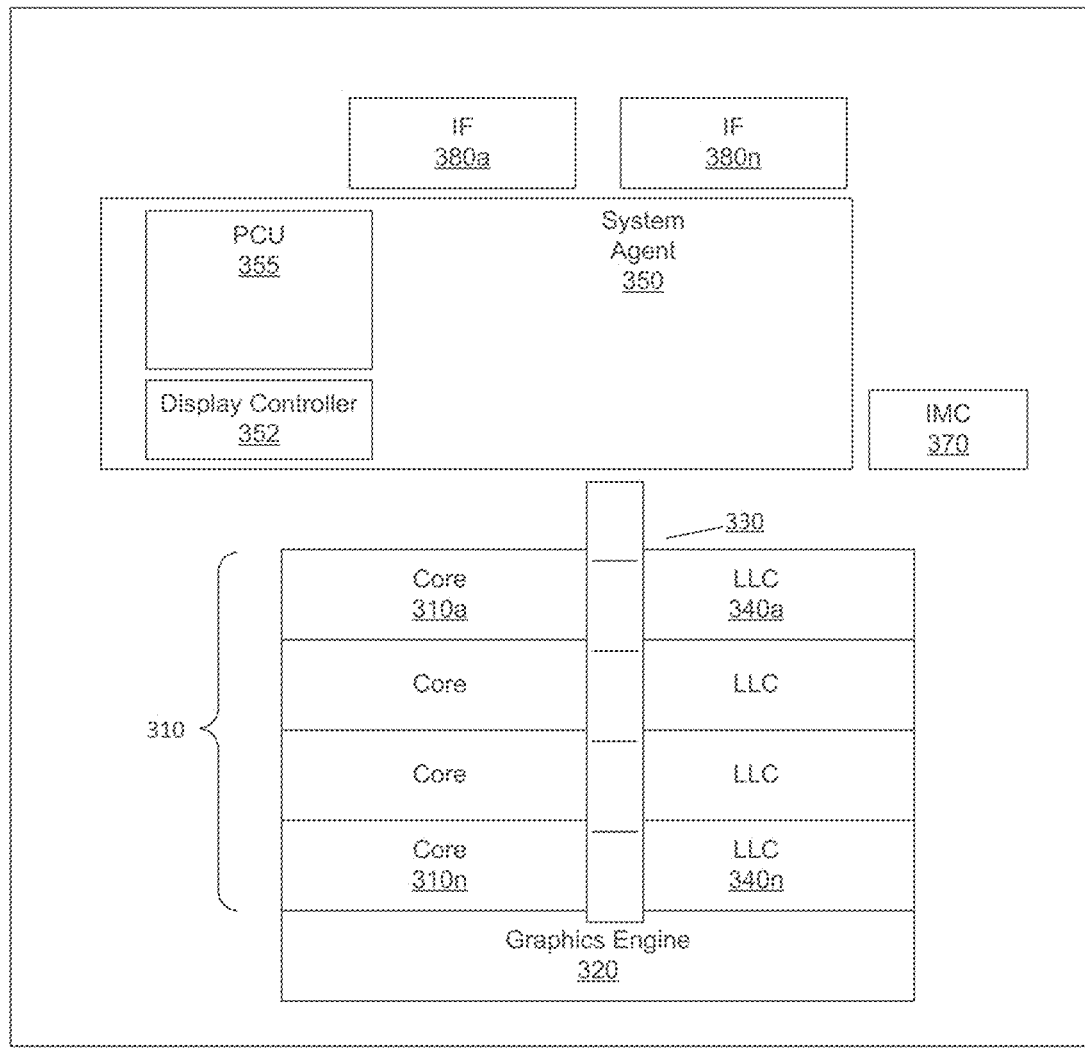
FIG. 3 is a block diagram of a multi-domain processor in accordance with another embodiment of the present invention.

Referring now to FIG. 3, shown is a block diagram of a multi-domain processor in accordance with another embodiment of the present invention. As shown in the embodiment of FIG. 3, processor 300 includes multiple domains. Specifically, a core domain 310 can include a plurality of cores 310a-310n, a graphics domain 320 can include one or more graphics engines, and a system agent domain 350 may further be present. In some embodiments, system agent domain 350 may execute at an independent frequency than the core domain and may remain powered on at all times to handle power control events and power management such that domains 310 and 320 can be controlled to dynamically enter into and exit high power and low power states. Each of domains 310 and 320 may operate at different voltage and/or power. Note that while only shown with three domains, understand the scope of the present invention is not limited in this regard and additional domains can be present in other embodiments. For example, multiple core domains may be present each including at least one core.

In general, each of the cores 310a-310n may further include low level caches in addition to various execution units and additional processing elements. In turn, the various cores may be coupled to each other and to a shared cache memory formed of a plurality of units of a last level cache (LLC) 340a-340n. In various embodiments, LLC 340 may be shared amongst the cores and the graphics engine, as well as various media processing circuitry. As seen, a ring interconnect 330 thus couples the cores together, and provides interconnection between the cores, graphics domain 320 and system agent domain 350. In one embodiment, interconnect 330 can be part of the core domain. However, in other embodiments the ring interconnect can be of its own domain.

As further seen, system agent domain 350 may include display controller 352 which may provide control of and an interface to an associated display. As further seen, system agent domain 350 may include a power control unit 355 which can include logic to perform the power management techniques described herein.

As further seen in FIG. 3, processor 300 can further include an integrated memory controller (IMC) 370 that can provide for an interface to a system memory, such as a dynamic random access memory (DRAM). Multiple interfaces 380a-380n may be present to enable interconnection between the processor and other circuitry. For example, in one embodiment at least one direct media interface (DMI) interface may be provided as well as one or more PCIe™ interfaces. Still further, to provide for communications between other agents such as additional processors or other circuitry, one or more QPI interfaces may also be provided. Although shown at this high level in the embodiment of FIG. 3, understand the scope of the present invention is not limited in this regard.

Although not shown in FIG. 3, in some embodiments, the processor 300 may include all or part of the reconfiguration logic described below with reference to FIGS. 17-20.

Figure 4:
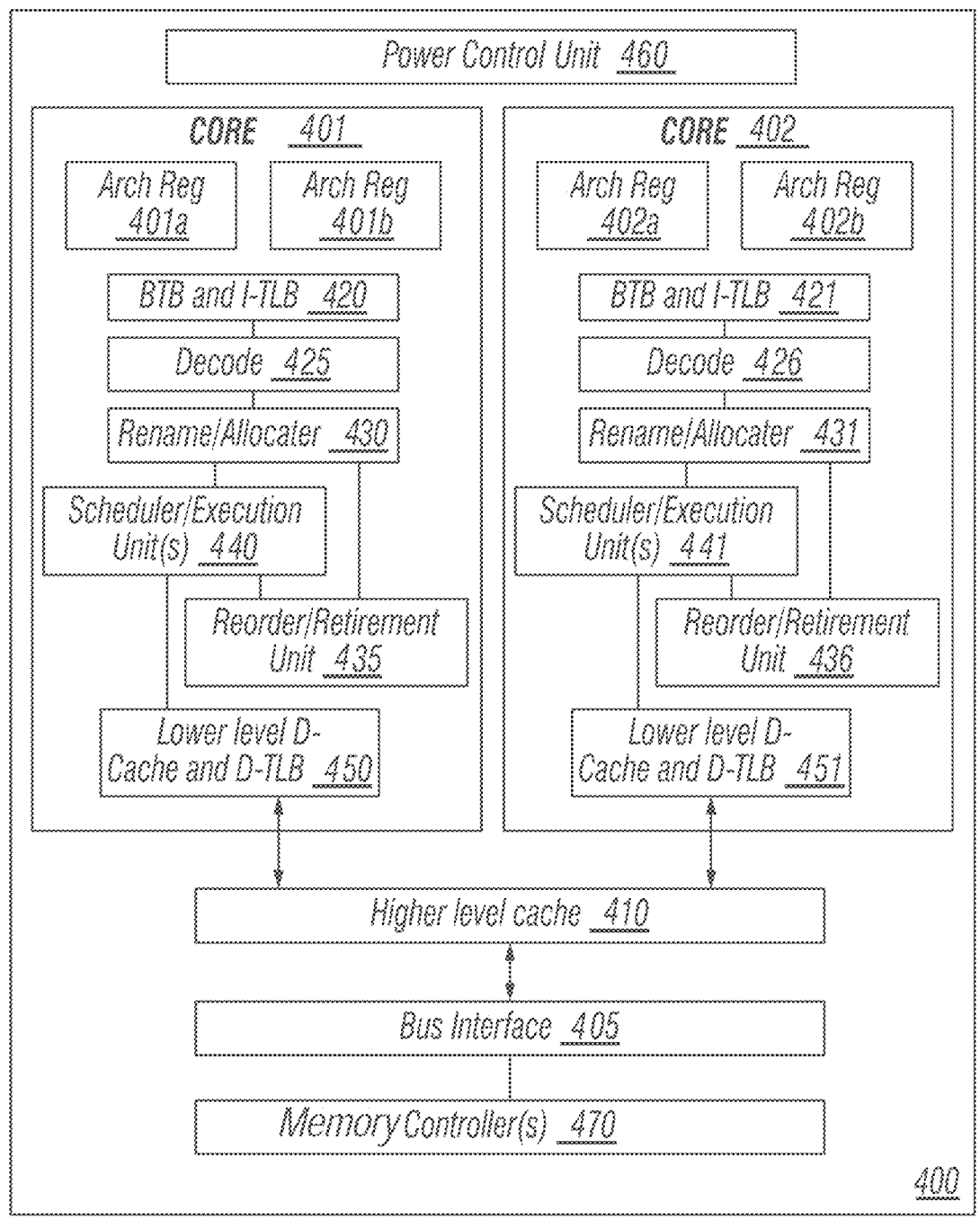
FIG. 4 is an embodiment of a processor including multiple cores.

Referring to FIG. 4, an embodiment of a processor including multiple cores is illustrated. Processor 400 includes any processor or processing device, such as a microprocessor, an embedded processor, a digital signal processor (DSP), a network processor, a handheld processor, an application processor, a co-processor, a system on a chip (SoC), or other device to execute code. Processor 400, in one embodiment, includes at least two cores—cores 401 and 402, which may include asymmetric cores or symmetric cores (the illustrated embodiment). However, processor 400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 400, as illustrated in FIG. 4, includes two cores, cores 401 and 402. Here, cores 401 and 402 are considered symmetric cores, i.e., cores with the same configurations, functional units, and/or logic. In another embodiment, core 401 includes an out-of-order processor core, while core 402 includes an in-order processor core. However, cores 401 and 402 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 401 are described in further detail below, as the units in core 402 operate in a similar manner.

As depicted, core 401 includes two hardware threads 401*a* and 401*b*, which may also be referred to as hardware thread slots 401*a* and 401*b*. Therefore, software entities, such as an operating system, in one embodiment potentially view processor 400 as four separate processors, i.e., four logical processors or processing elements capable of executing four software threads concurrently. As alluded to above, a first thread is associated with architecture state registers 401*a*, a second thread is associated with architecture state registers 401*b*, a third thread may be associated with architecture state registers 402*a*, and a fourth thread may be associated with architecture state registers 402*b*. Here, each of the architecture state registers (401*a*, 401*b*, 402*a*, and 402*b*) may be referred to as processing elements, thread slots, or thread units, as described above. As illustrated, architecture state registers 401*a* are replicated in architecture state registers 401*b*, so individual architecture states/contexts are capable of being stored for logical processor 401*a* and logical processor 401*b*. In core 401, other smaller resources, such as instruction pointers and renaming logic in allocator and renamer block 430 may also be replicated for threads 401*a* and 401*b*. Some resources, such as re-order buffers in reorder/retirement unit 435, branch target buffer and instruction translation lookaside buffer (BTB and I-TLB) 420, load/store buffers, and queues may be shared through partitioning. Other resources, such as general purpose internal registers, page-table base register(s), low-level data-cache and data-TLB 450, execution unit(s) 440, and portions of reorder/retirement unit 435 are potentially fully shared.

Processor 400 often includes other resources, which may be fully shared, shared through partitioning, or dedicated by/to processing elements. In FIG. 4, an embodiment of a purely exemplary processor with illustrative logical units/resources of a processor is illustrated. Note that a processor may include, or omit, any of these functional units, as well as include any other known functional units, logic, or firmware not depicted. As illustrated, core 401 includes a simplified, representative out-of-order (OOO) processor core. But an in-order processor may be utilized in different embodiments.

Core 401 further includes decode module 425 coupled to a fetch unit to decode fetched elements. Fetch logic, in one embodiment, includes individual sequencers associated with thread slots 401*a*, 401*b*, respectively. Usually core 401 is associated with a first ISA, which defines/specifies instructions executable on processor 400. Often machine code instructions that are part of the first ISA include a portion of the instruction (referred to as an opcode), which references/specifies an instruction or operation to be performed. Decode module 425 includes circuitry that recognizes these instructions from their opcodes and passes the decoded instructions on in the pipeline for processing as defined by the first ISA. For example, decoder module 425, in one embodiment, includes logic designed or adapted to recognize specific instructions, such as transactional instruction. As a result of the recognition by the decoder module 425, the architecture or core 401 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 430 includes an allocator to reserve resources, such as register files to store instruction processing results. However, threads 401*a* and 401*b* are potentially capable of out-of-order execution, where allocator and renamer block 430 also reserves other resources, such as reorder buffers to track instruction results. The renamer block 430 may also include a register renamer to rename program/instruction reference registers to other registers internal to processor 400. Reorder/retirement unit 435 includes components, such as the reorder buffers mentioned above, load buffers, and store buffers, to support out-of-order execution and later in-order retirement of instructions executed out-of-order.

Scheduler and execution unit(s) block 440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation lookaside buffer (D-TLB) 450 are coupled to execution unit(s) 440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 401 and 402 share access to higher-level or further-out cache 410, which is to cache recently fetched elements. Note that higher-level or further-out refers to cache levels increasing or getting further away from the execution unit(s). In one embodiment, higher-level cache 410 is a last-level data cache—last cache in the memory hierarchy on processor 400—such as a second or third level data cache. However, higher level cache 410 is not so limited, as it may be associated with or includes an instruction cache. A trace cache—a type of instruction cache—instead may be coupled after decoder module 425 to store recently decoded traces.

In the depicted configuration, processor 400 also includes bus interface 405 and a power control unit 460, which may perform power management in accordance with an embodiment of the present invention. In this scenario, bus interface 405 is to communicate with devices external to processor 400, such as system memory and other components.

A memory controller 470 may interface with other devices such as one or many memories. In an example, bus interface 405 includes a ring interconnect with a memory controller for interfacing with a memory and a graphics controller for interfacing with a graphics processor. In an SoC environment, even more devices, such as a network interface, coprocessors, memory, graphics processor, and any other known computer devices/interface may be integrated on a single die or integrated circuit to provide small form factor with high functionality and low power consumption.

Although not shown in FIG. 4, in some embodiments, the processor 400 may include all or part of the reconfiguration logic described below with reference to FIGS. 17-20.

Figure 5:
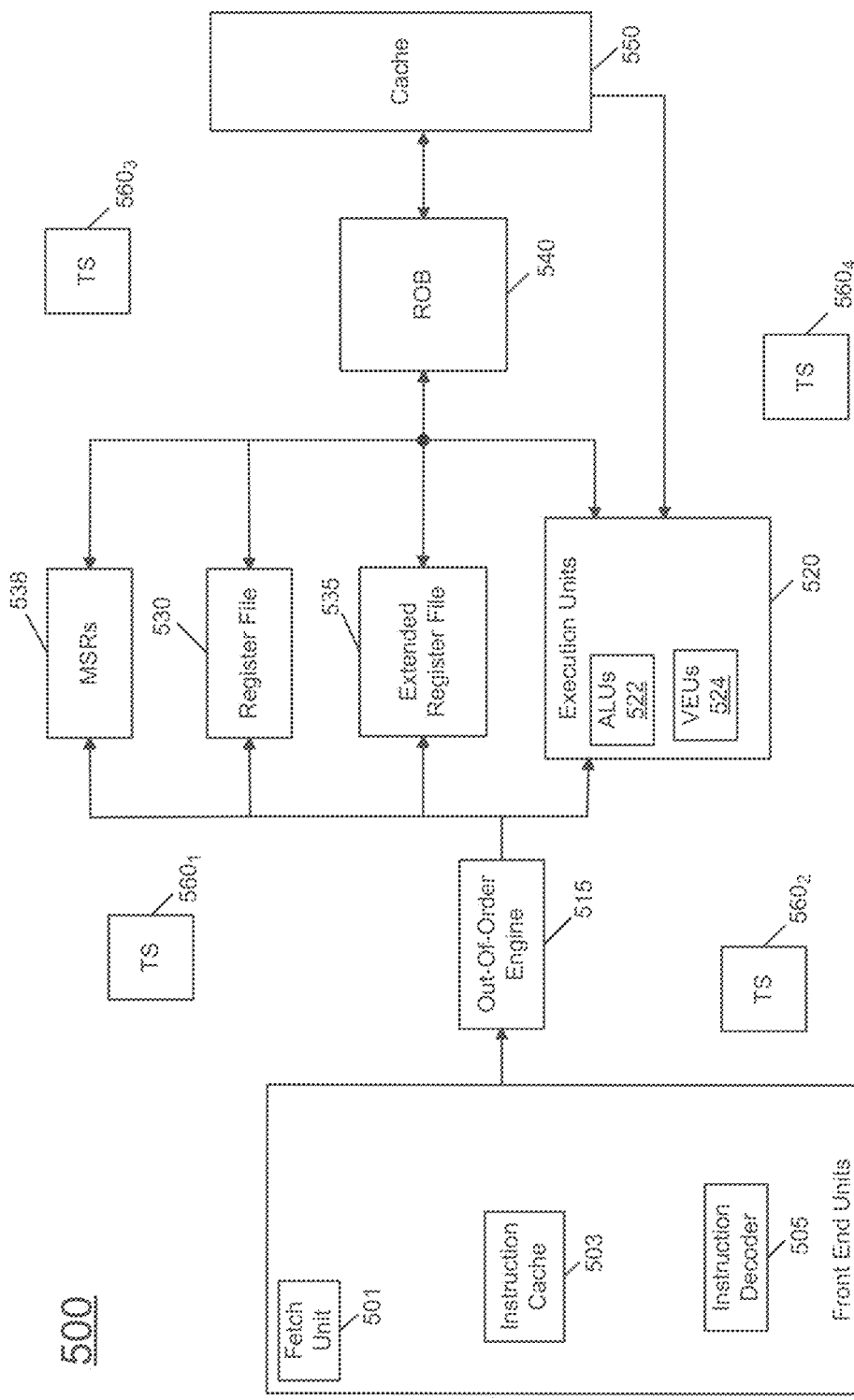
FIG. 5 is a block diagram of a micro-architecture of a processor core in accordance with one embodiment of the present invention.

Referring now to FIG. 5, shown is a block diagram of a micro-architecture of a processor core in accordance with one embodiment of the present invention. As shown in FIG. 5, processor core 500 may be a multi-stage pipelined out-of-order processor. Core 500 may operate at various voltages based on a received operating voltage, which may be received from an integrated voltage regulator or external voltage regulator.

As seen in FIG. 5, core 500 includes front end units 510, which may be used to fetch instructions to be executed and prepare them for use later in the processor pipeline. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to re-order micro-instruction flow and allocate various resources needed for execution, as well as to provide renaming of logical registers onto storage locations within various register files such as register file 530 and extended register file 535. Register file 530 may include separate register files for integer and floating point operations. For purposes of configuration, control, and additional operations, a set of machine specific registers (MSRs) 538 may also be present and accessible to various logic within core 500 (and external to the core).

Various resources may be present in execution units 520, including, for example, various integer, floating point, and single instruction multiple data (SIMD) logic units, among other specialized hardware. For example, such execution units may include one or more arithmetic logic units (ALUs) 522 and one or more vector execution units 524, among other such execution units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of an Intel® x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Although not shown in FIG. 5, in some embodiments, the core 500 may include all or part of the reconfiguration logic described below with reference to FIGS. 17-20.

Figure 6:
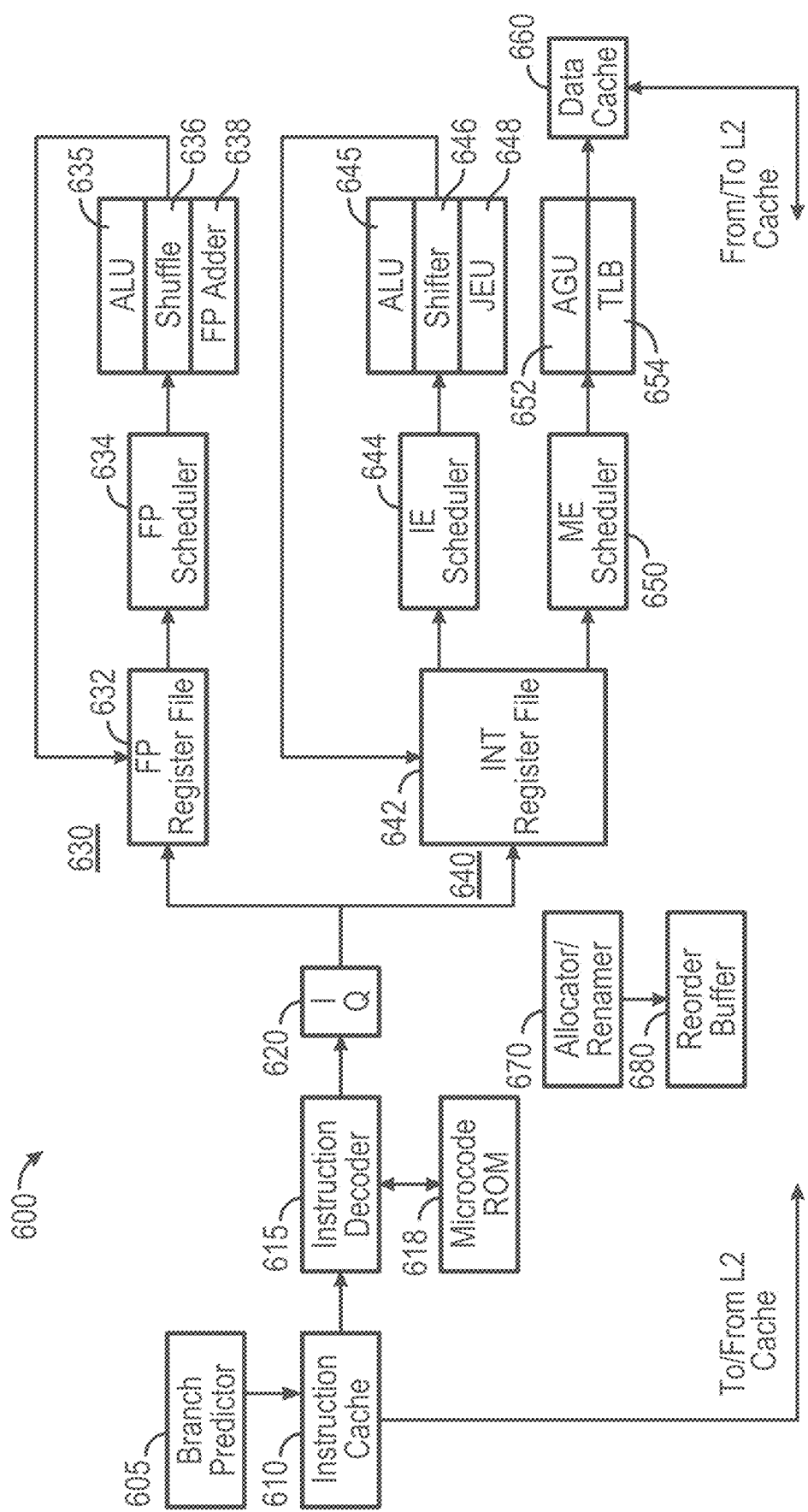
FIG. 6 is a block diagram of a micro-architecture of a processor core in accordance with another embodiment.

Referring now to FIG. 6, shown is a block diagram of a micro-architecture of a processor core in accordance with another embodiment. In the embodiment of FIG. 6, core 600 may be a low power core of a different micro-architecture, such as an Intel® Atom™-based processor having a relatively limited pipeline depth designed to reduce power consumption. As seen, core 600 includes an instruction cache 610 coupled to provide instructions to an instruction decoder 615. A branch predictor 605 may be coupled to instruction cache 610. Note that instruction cache 610 may further be coupled to another level of a cache memory, such as an L2 cache (not shown for ease of illustration in FIG. 6). In turn, instruction decoder 615 provides decoded instructions to an issue queue (IQ) 620 for storage and delivery to a given execution pipeline. A microcode ROM 618 is coupled to instruction decoder 615.

A floating point pipeline 630 includes a floating point (FP) register file 632 which may include a plurality of architectural registers of a given bit width such as 128, 256 or 512 bits. Pipeline 630 includes a floating point scheduler 634 to schedule instructions for execution on one of multiple execution units of the pipeline. In the embodiment shown, such execution units include an ALU 635, a shuffle unit 636, and a floating point adder 638. In turn, results generated in these execution units may be provided back to buffers and/or registers of register file 632. Of course understand while shown with these few example execution units, additional or different floating point execution units may be present in another embodiment.

An integer pipeline 640 also may be provided. In the embodiment shown, pipeline 640 includes an integer (INT)

register file 642 which may include a plurality of architectural registers of a given bit width such as 128 or 256 bits. Pipeline 640 includes an integer execution (IE) scheduler 644 to schedule instructions for execution on one of multiple execution units of the pipeline. In the embodiment shown, such execution units include an ALU 645, a shifter unit 646, and a jump execution unit (JEU) 648. In turn, results generated in these execution units may be provided back to buffers and/or registers of register file 642. Of course understand while shown with these few example execution units, additional or different integer execution units may be present in another embodiment.

A memory execution (ME) scheduler 650 may schedule memory operations for execution in an address generation unit (AGU) 652, which is also coupled to a TLB 654. As seen, these structures may couple to a data cache 660, which may be a L0 and/or L1 data cache that in turn couples to additional levels of a cache memory hierarchy, including an L2 cache memory.

To provide support for out-of-order execution, an allocator/renamer 670 may be provided, in addition to a reorder buffer 680, which is configured to reorder instructions executed out of order for retirement in order. Although shown with this particular pipeline architecture in the illustration of FIG. 6, understand that many variations and alternatives are possible.

Although not shown in FIG. 6, in some embodiments, the core 600 may include all or part of the reconfiguration logic described below with reference to FIGS. 17-20.

Note that in a processor having asymmetric cores, such as in accordance with the micro-architectures of FIGS. 5 and 6, workloads may be dynamically swapped between the cores for power management reasons, as these cores, although having different pipeline designs and depths, may be of the same or related ISA. Such dynamic core swapping may be performed in a manner transparent to a user application (and possibly kernel also).

Figure 7:
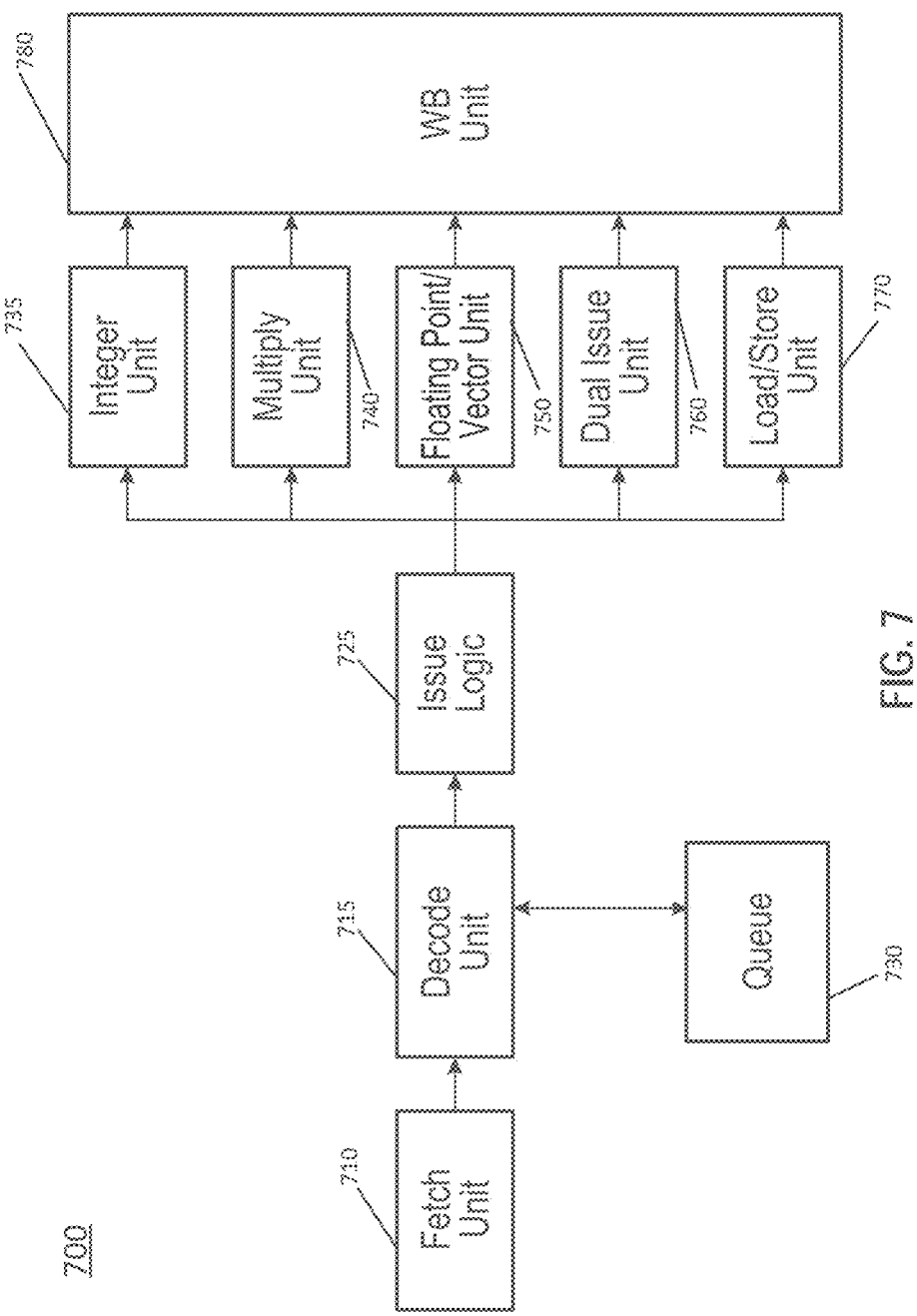
FIG. 7 is a block diagram of a micro-architecture of a processor core in accordance with yet another embodiment.

Referring to FIG. 7, shown is a block diagram of a micro-architecture of a processor core in accordance with yet another embodiment. As illustrated in FIG. 7, a core 700 may include a multi-staged in-order pipeline to execute at very low power consumption levels. As one such example, core 700 may have a micro-architecture in accordance with an ARM Cortex A53 design available from ARM Holdings, LTD., Sunnyvale, Calif. In an implementation, an 8-stage pipeline may be provided that is configured to execute both 32-bit and 64-bit code. Core 700 includes a fetch unit 710 that is configured to fetch instructions and provide them to a decode unit 715, which may decode the instructions, e.g., macro-instructions of a given ISA such as an ARMv8 ISA. Note further that a queue 730 may couple to decode unit 715 to store decoded instructions. Decoded instructions are provided to an issue logic 725, where the decoded instructions may be issued to a given one of multiple execution units.

With further reference to FIG. 7, issue logic 725 may issue instructions to one of multiple execution units. In the embodiment shown, these execution units include an integer unit 735, a multiply unit 740, a floating point/vector unit 750, a dual issue unit 760, and a load/store unit 770. The results of these different execution units may be provided to a writeback (WB) unit 780. Understand that while a single writeback unit is shown for ease of illustration, in some implementations separate writeback units may be associated with each of the execution units. Furthermore, understand that while each of the units and logic shown in FIG. 7 is represented at a high level, a particular implementation may include more or different structures. A processor designed using one or more cores having a pipeline as in FIG. 7 may be implemented in many different end products, extending from mobile devices to server systems.

Although not shown in FIG. 7, in some embodiments, the core 700 may include all or part of the reconfiguration logic described below with reference to FIGS. 17-20.

Figure 8:
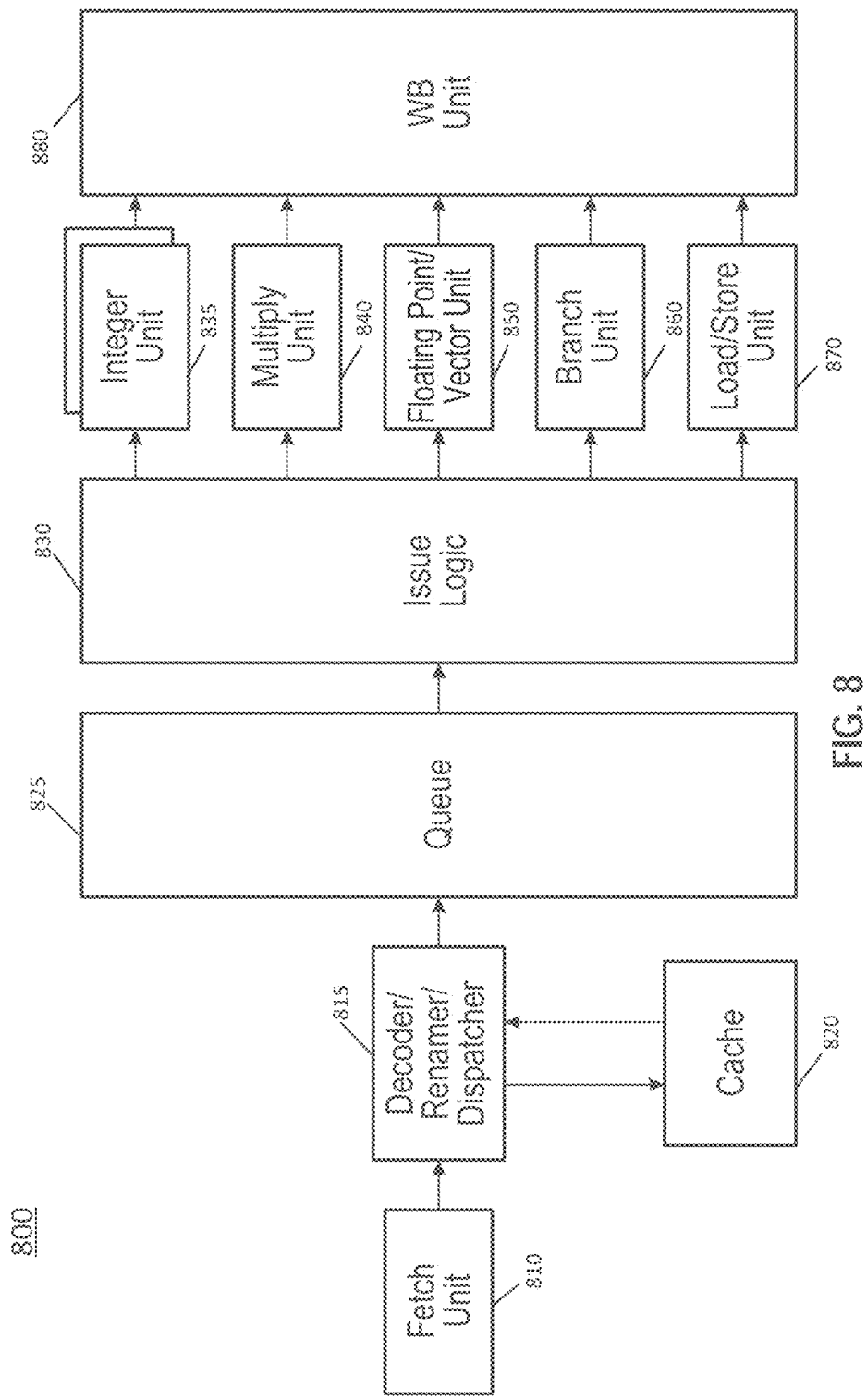
FIG. 8 is a block diagram of a micro-architecture of a processor core in accordance with a still further embodiment.

Referring to FIG. 8, shown is a block diagram of a micro-architecture of a processor core in accordance with a still further embodiment. As illustrated in FIG. 8, a core 800 may include a multi-stage multi-issue out-of-order pipeline to execute at very high performance levels (which may occur at higher power consumption levels than core 700 of FIG. 7). As one such example, processor 800 may have a microarchitecture in accordance with an ARM Cortex A57 design. In an implementation, a 15 (or greater)-stage pipeline may be provided that is configured to execute both 32-bit and 64-bit code. In addition, the pipeline may provide for 3 (or greater)-wide and 3 (or greater)-issue operation. Core 800 includes a fetch unit 810 that is configured to fetch instructions and provide them to a decoder/renamer/dispatcher unit 815 coupled to a cache 820. Unit 815 may decode the instructions, e.g., macro-instructions of an ARMv8 instruction set architecture, rename register references within the instructions, and dispatch the instructions (eventually) to a selected execution unit. Decoded instructions may be stored in a queue 825. Note that while a single queue structure is shown for ease of illustration in FIG. 8, understand that separate queues may be provided for each of the multiple different types of execution units.

Also shown in FIG. 8 is an issue logic 830 from which decoded instructions stored in queue 825 may be issued to a selected execution unit. Issue logic 830 also may be implemented in a particular embodiment with a separate issue logic for each of the multiple different types of execution units to which issue logic 830 couples.

Decoded instructions may be issued to a given one of multiple execution units. In the embodiment shown, these execution units include one or more integer units 835, a multiply unit 840, a floating point/vector unit 850, a branch unit 860, and a load/store unit 870. In an embodiment, floating point/vector unit 850 may be configured to handle SIMD or vector data of 128 or 256 bits. Still further, floating point/vector execution unit 850 may perform IEEE-754 double precision floating-point operations. The results of these different execution units may be provided to a writeback unit 880. Note that in some implementations separate writeback units may be associated with each of the execution units. Furthermore, understand that while each of the units and logic shown in FIG. 8 is represented at a high level, a particular implementation may include more or different structures.

Although not shown in FIG. 8, in some embodiments, the core 800 may include all or part of the reconfiguration logic described below with reference to FIGS. 17-20.

Note that in a processor having asymmetric cores, such as in accordance with the micro-architectures of FIGS. 7 and 8, workloads may be dynamically swapped for power management reasons, as these cores, although having different pipeline designs and depths, may be of the same or related ISA. Such dynamic core swapping may be performed in a manner transparent to a user application (and possibly kernel also).

Figure 9:
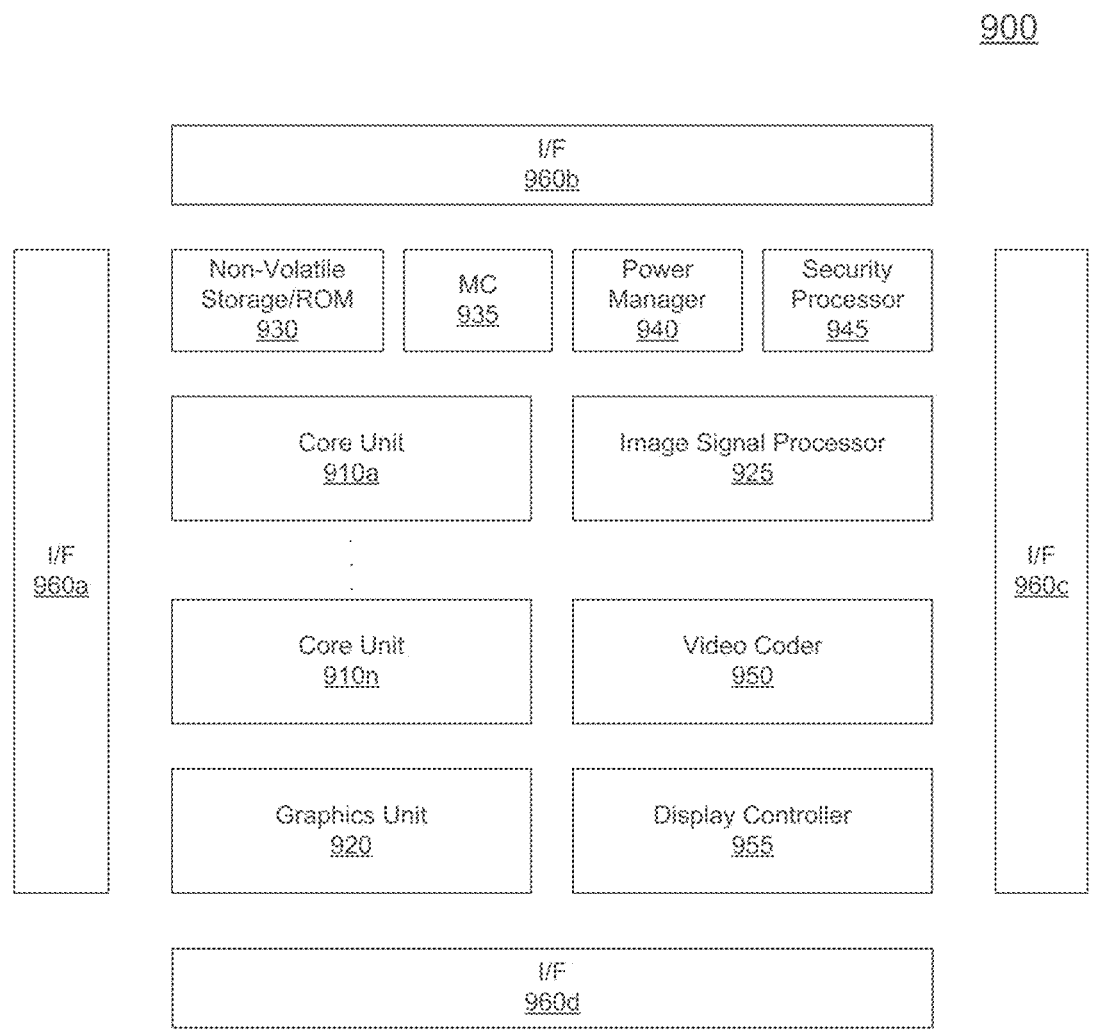
FIG. 9 is a block diagram of a processor in accordance with another embodiment of the present invention.

A processor designed using one or more cores having pipelines as in any one or more of FIGS. 5-8 may be implemented in many different end products, extending from mobile devices to server systems. Referring now to FIG. 9, shown is a block diagram of a processor in accordance with another embodiment of the present invention. In the embodiment of FIG. 9, processor 900 may be a SoC including multiple domains, each of which may be controlled to operate at an independent operating voltage and operating frequency. As a specific illustrative example, processor 900 may be an Intel® Architecture Core™-based processor such as an i3, i5, i7 or another such processor available from Intel Corporation. However, other low power processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer or other portable computing device, which may incorporate a heterogeneous system architecture having a heterogeneous system architecture-based processor design.

In the high level view shown in FIG. 9, processor 900 includes a plurality of core units 910a-910n. Each core unit may include one or more processor cores, one or more cache memories and other circuitry. Each core unit 910 may support one or more instruction sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level two (L2) cache memory. A non-volatile storage 930 may be used to store various program and other data. For example, this storage may be used to store at least portions of microcode, boot information such as a BIOS, other system software or so forth.

Each core unit 910 may also include an interface such as a bus interface unit to enable interconnection to additional circuitry of the processor. In an embodiment, each core unit 910 couples to a coherent fabric that may act as a primary cache coherent on-die interconnect that in turn couples to a memory controller 935. In turn, memory controller 935 controls communications with a memory such as a DRAM (not shown for ease of illustration in FIG. 9).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 9, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations such as secure boot operations, various cryptography operations and so forth.

Each of the units may have its power consumption controlled via a power manager 940, which may include control logic to perform the various power management techniques described herein.

In some embodiments, processor 900 may further include a non-coherent fabric coupled to the coherent fabric to which various peripheral devices may couple. One or more interfaces 960a-960d enable communication with one or more off-chip devices. Such communications may be via a variety of communication protocols such as PCIe™, GPIO, USB, I²C, UART, MIPI, SDIO, DDR, SPI, HDMI, among other types of communication protocols. Although shown at this high level in the embodiment of FIG. 9, understand the scope of the present invention is not limited in this regard.

Although not shown in FIG. 9, in some embodiments, the processor 900 may include all or part of the reconfiguration logic described below with reference to FIGS. 17-20.

Figure 10:
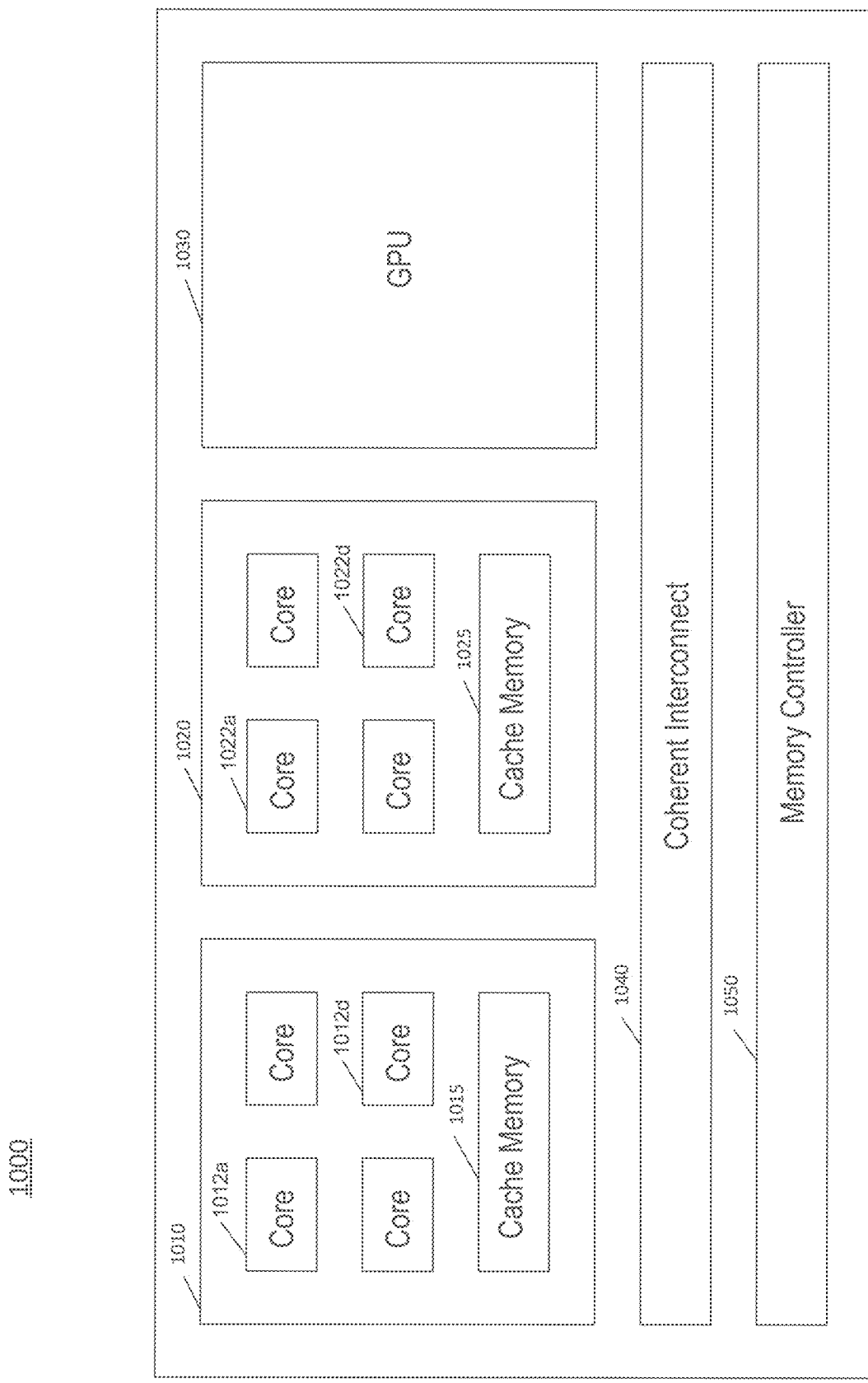
FIG. 10 is a block diagram of a representative SoC in accordance with an embodiment of the present invention.

Referring now to FIG. 10, shown is a block diagram of a representative SoC. In the embodiment shown, SoC 1000 may be a multi-core SoC configured for low power operation to be optimized for incorporation into a smartphone or other low power device such as a tablet computer or other portable computing device. As an example, SoC 1000 may be implemented using asymmetric or different types of cores, such as combinations of higher power and/or low power cores, e.g., out-of-order cores and in-order cores. In different embodiments, these cores may be based on an Intel® Architecture™ core design or an ARM architecture design. In yet other embodiments, a mix of Intel and ARM cores may be implemented in a given SoC.

As seen in FIG. 10, SoC 1000 includes a first core domain 1010 having a plurality of first cores 1012a-1012d. In an example, these cores may be low power cores such as in-order cores. In one embodiment, these first cores may be implemented as ARM Cortex A53 cores. In turn, these cores couple to a cache memory 1015 of core domain 1010. In addition, SoC 1000 includes a second core domain 1020. In the illustration of FIG. 10, second core domain 1020 has a plurality of second cores 1022a-1022d. In an example, these cores may be higher power-consuming cores than first cores 1012. In an embodiment, the second cores may be out-of-order cores, which may be implemented as ARM Cortex A57 cores. In turn, these cores couple to a cache memory 1025 of core domain 1020. Note that while the example shown in FIG. 10 includes 4 cores in each domain, understand that more or fewer cores may be present in a given domain in other examples.

With further reference to FIG. 10, a graphics domain 1030 also is provided, which may include one or more graphics processing units (GPUs) configured to independently execute graphics workloads, e.g., provided by one or more cores of core domains 1010 and 1020. As an example, GPU domain 1030 may be used to provide display support for a variety of screen sizes, in addition to providing graphics and display rendering operations.

As seen, the various domains couple to a coherent interconnect 1040, which in an embodiment may be a cache coherent interconnect fabric that in turn couples to an integrated memory controller 1050. Coherent interconnect 1040 may include a shared cache memory, such as an L3 cache, in some examples. In an embodiment, memory controller 1050 may be a direct memory controller to provide for multiple channels of communication with an off-chip memory, such as multiple channels of a DRAM (not shown for ease of illustration in FIG. 10).

In different examples, the number of the core domains may vary. For example, for a low power SoC suitable for incorporation into a mobile computing device, a limited number of core domains such as shown in FIG. 10 may be present. Still further, in such low power SoCs, core domain 1020 including higher power cores may have fewer numbers of such cores. For example, in one implementation two cores 1022 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional IP logic may be present, in that an SoC can be scaled to higher performance (and power) levels for incorporation into other computing devices, such as desktops, servers, high performance computing systems, base stations forth. As one such example, 4 core domains each having a given number of out-of-order cores may be provided. Still further, in addition to optional GPU support (which as an example may take the form of a GPGPU), one or more accelerators to provide optimized hardware support for particular functions (e.g. web serving, network processing, switching or so forth) also may be provided. In addition, an input/output interface may be present to couple such accelerators to off-chip components.

Although not shown in FIG. 10, in some embodiments, the SoC 1000 may include all or part of the reconfiguration logic described below with reference to FIGS. 17-20.

Figure 11:
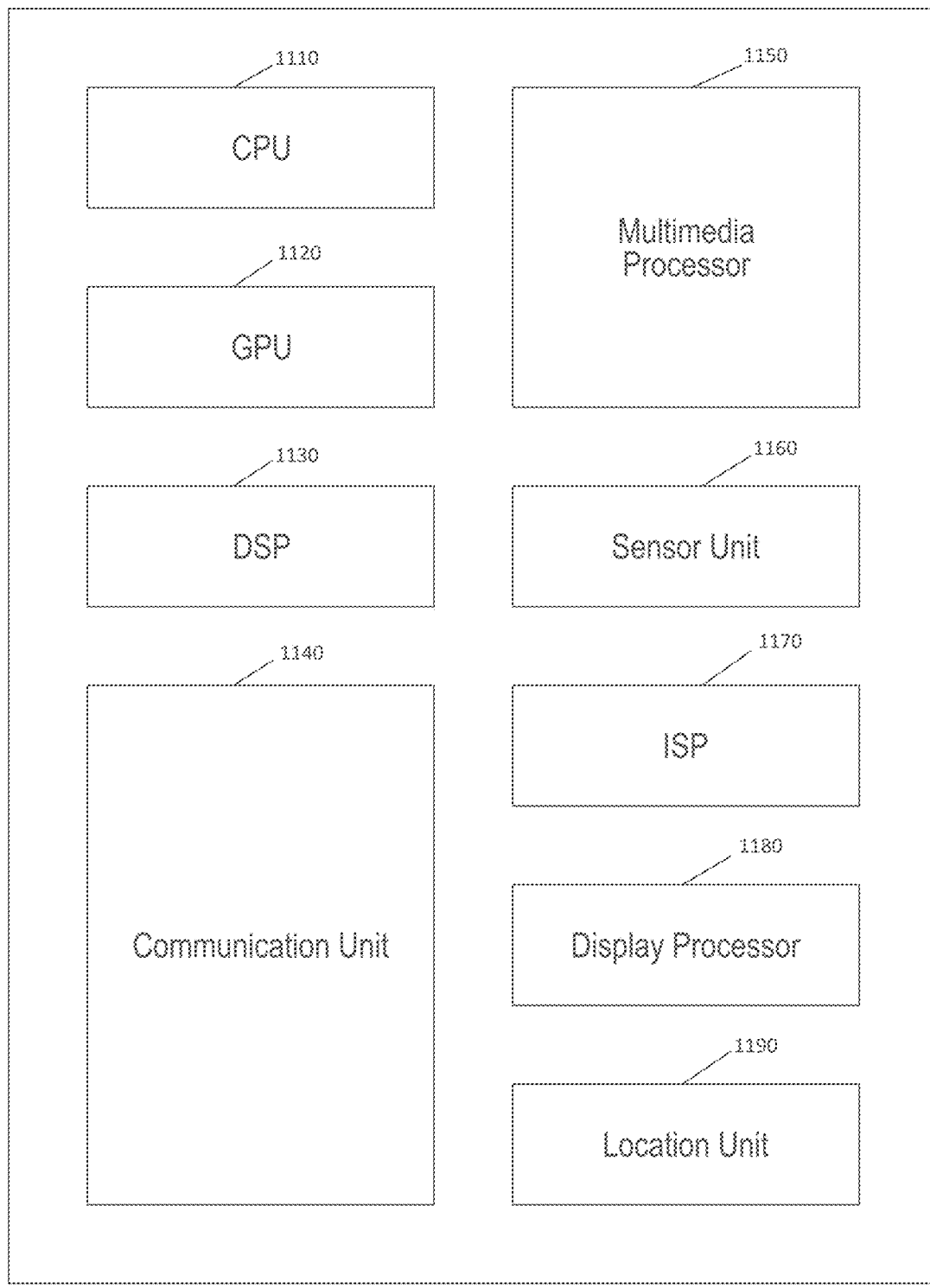
FIG. 11 is a block diagram of another example SoC in accordance with an embodiment of the present invention.

Referring now to FIG. 11, shown is a block diagram of another example SoC. In the embodiment of FIG. 11, SoC 1100 may include various circuitry to enable high performance for multimedia applications, communications and other functions. As such, SoC 1100 is suitable for incorporation into a wide variety of portable and other devices, such as smartphones, tablet computers, smart TVs and so forth. In the example shown, SoC 1100 includes a central processor unit (CPU) domain 1110. In an embodiment, a plurality of individual processor cores may be present in CPU domain 1110. As one example, CPU domain 1110 may be a quad core processor having 4 multithreaded cores. Such processors may be homogeneous or heterogeneous processors, e.g., a mix of low power and high power processor cores.

In turn, a GPU domain 1120 is provided to perform advanced graphics processing in one or more GPUs to handle graphics and compute APIs. A DSP unit 1130 may provide one or more low power DSPs for handling low-power multimedia applications such as music playback, audio/video and so forth, in addition to advanced calculations that may occur during execution of multimedia instructions. In turn, a communication unit 1140 may include various components to provide connectivity via various wireless protocols, such as cellular communications (including 3G/4G LTE), wireless local area protocols such as Bluetooth™ IEEE 802.11, and so forth.

Still further, a multimedia processor 1150 may be used to perform capture and playback of high definition video and audio content, including processing of user gestures. A sensor unit 1160 may include a plurality of sensors and/or a sensor controller to interface to various off-chip sensors present in a given platform. An image signal processor 1170 may be provided with one or more separate ISPs to perform image processing with regard to captured content from one or more cameras of a platform, including still and video cameras.

A display processor 1180 may provide support for connection to a high definition display of a given pixel density, including the ability to wirelessly communicate content for playback on such display. Still further, a location unit 1190 may include a GPS receiver with support for multiple GPS constellations to provide applications highly accurate positioning information obtained using as such GPS receiver. Understand that while shown with this particular set of components in the example of FIG. 11, many variations and alternatives are possible.

Although not shown in FIG. 11, in some embodiments, the SoC 1100 may include all or part of the reconfiguration logic described below with reference to FIGS. 17-20.

Figure 12:
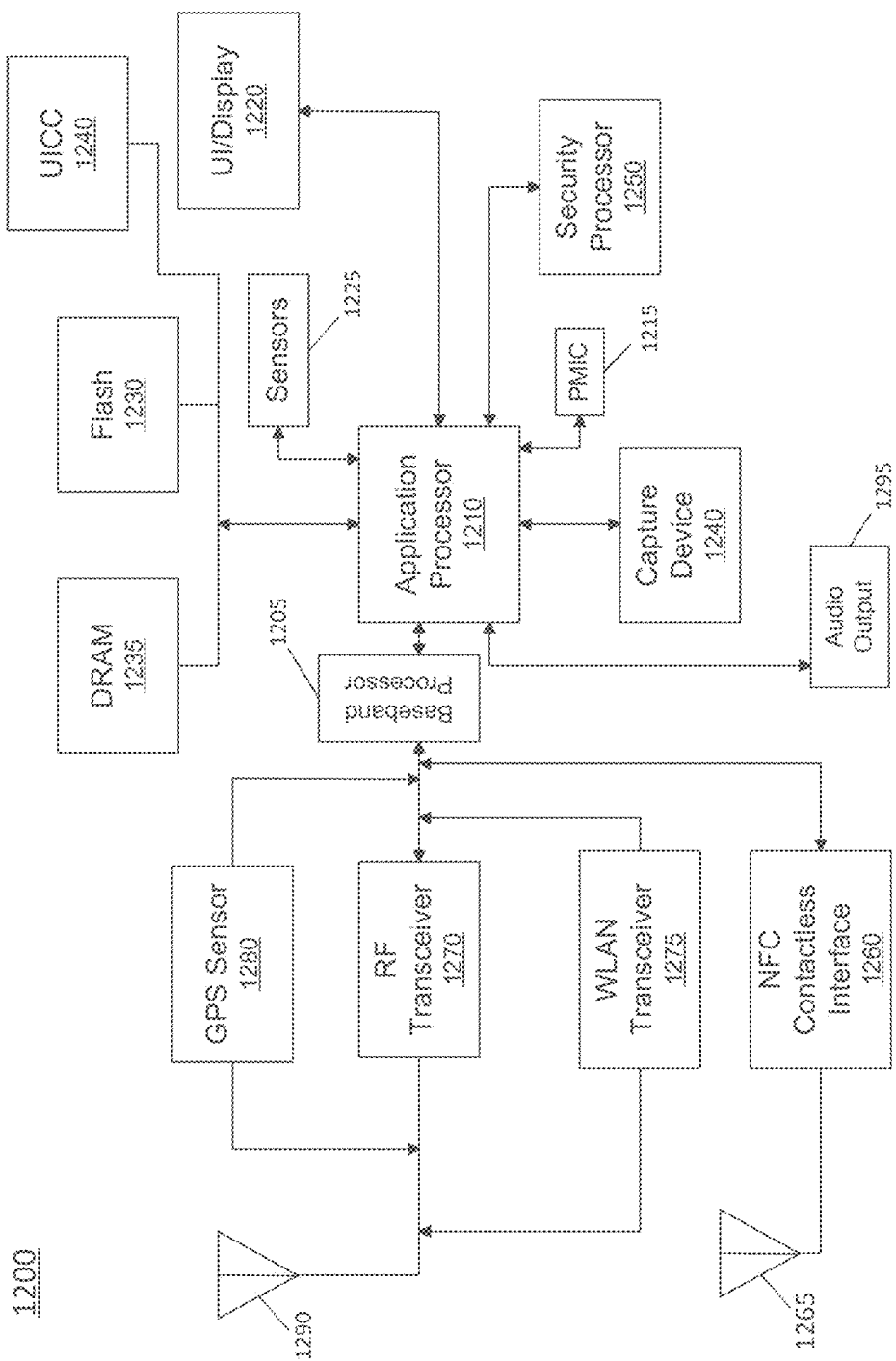
FIG. 12 is a block diagram of an example system with which embodiments can be used.

Referring now to FIG. 12, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main CPU of the system to execute an OS and other system software, in addition to user applications such as many well-known social media and multimedia apps. Application processor 1210 may further be configured to perform a variety of other computing operations for the device.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1240 such as one or more image capture devices that can record video and/or still images.

Still referring to FIG. 12, a universal integrated circuit card (UICC) 1246 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 12, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications can also be realized.

Although not shown in FIG. 12, in some embodiments, the system 1200 may include all or part of the reconfiguration logic described below with reference to FIGS. 17-20.

Figure 13:
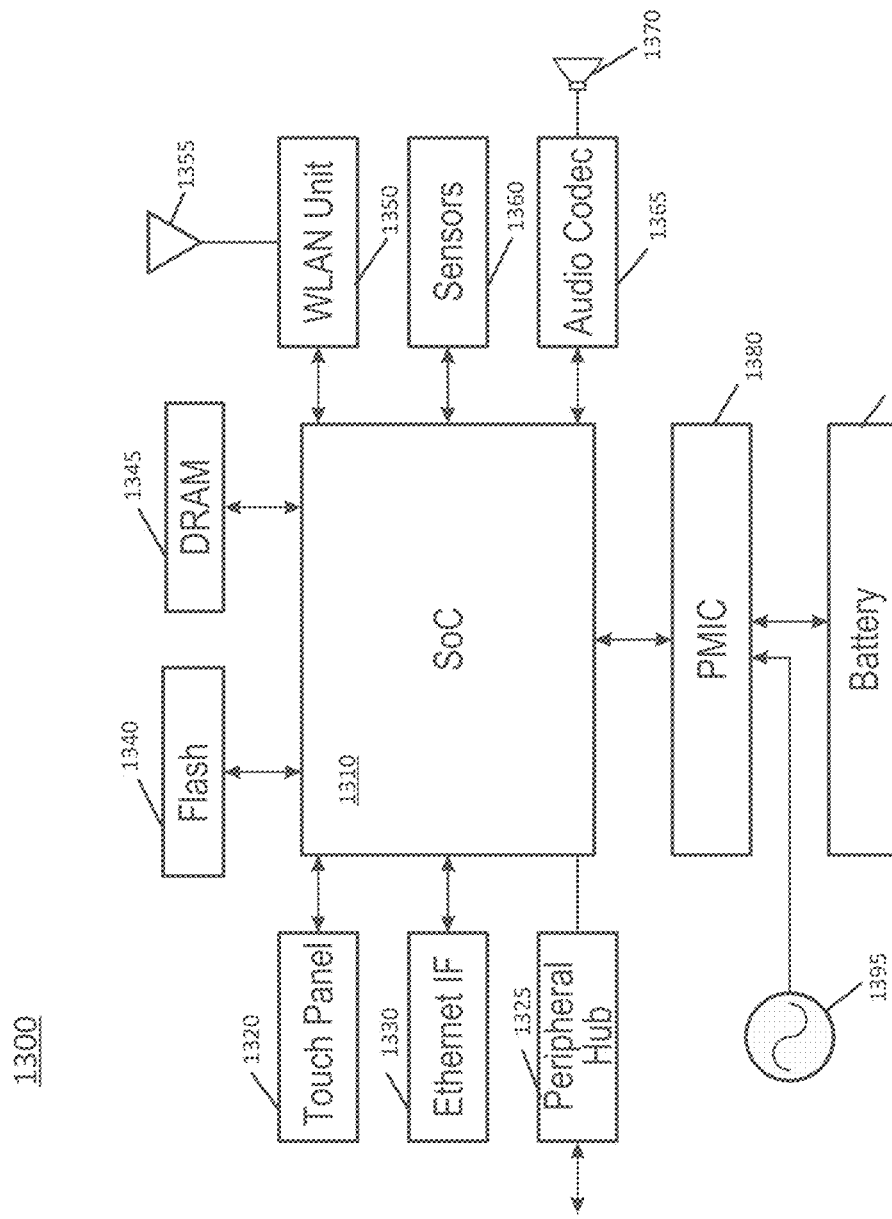
FIG. 13 is a block diagram of another example system with which embodiments may be used.

Referring now to FIG. 13, shown is a block diagram of another example system with which embodiments may be used. In the illustration of FIG. 13, system 1300 may be mobile low-power system such as a tablet computer, 2:1 tablet, phablet or other convertible or standalone tablet system. As illustrated, a SoC 1310 is present and may be configured to operate as an application processor for the device.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 13, to provide for wireless capabilities, a WLAN unit 1350 is coupled to SoC 1310 and in turn to an antenna 1355. In various implementations, WLAN unit 1350 may provide for communication according to one or more wireless protocols.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 13, many variations and alternatives are possible.

Although not shown in FIG. 13, in some embodiments, the system 1300 may include all or part of the reconfiguration logic described below with reference to FIGS. 17-20.

Figure 14:
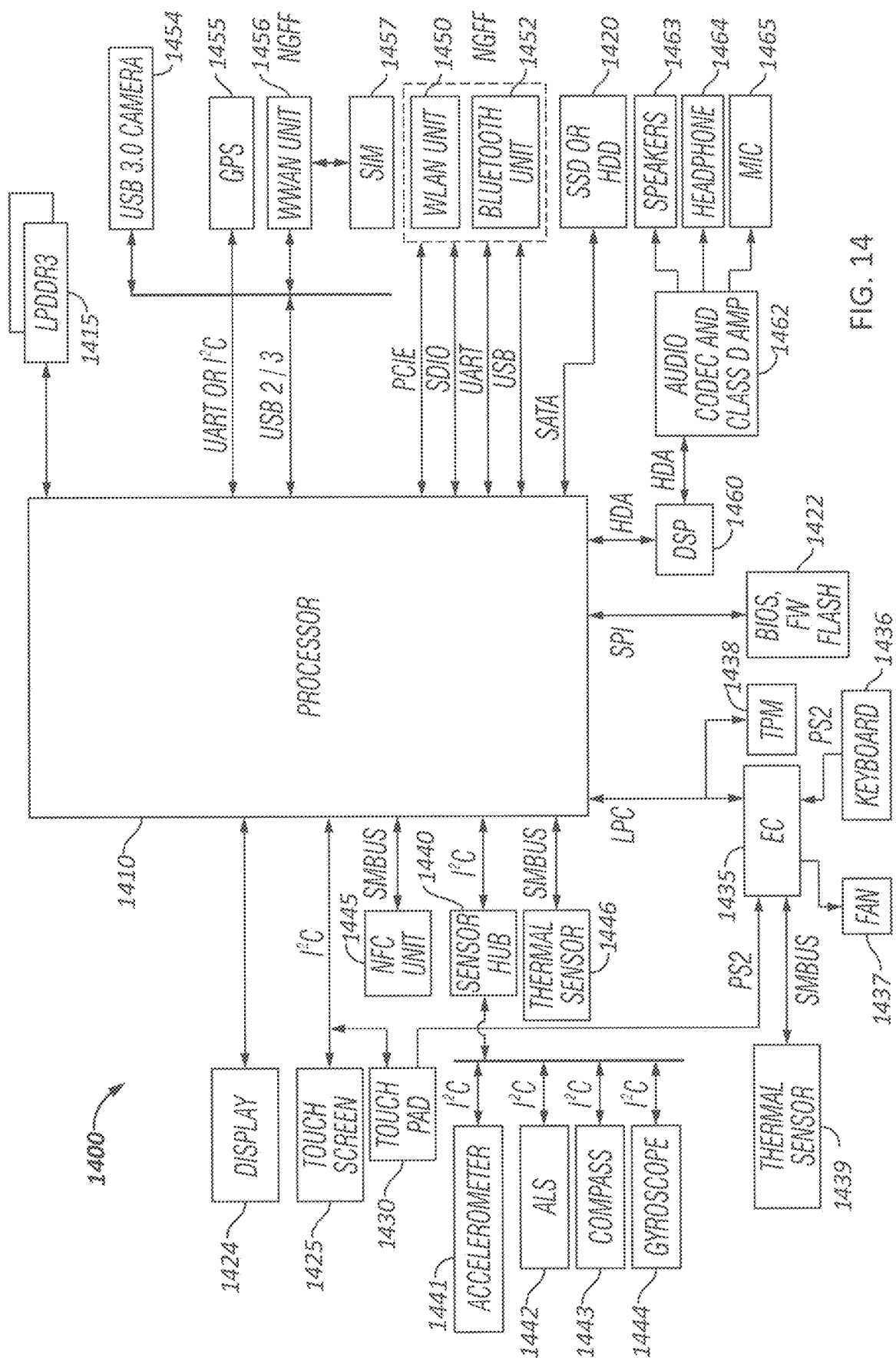
FIG. 14 is a block diagram of a representative computer system.

Referring now to FIG. 14, shown is a block diagram of a representative computer system 1400 such as notebook, Ultrabook™ or other small form factor system. A processor 1410, in one embodiment, includes a microprocessor, multi-core processor, multithreaded processor, an ultra low voltage processor, an embedded processor, or other known processing element. In the illustrated implementation, processor 1410 acts as a main processing unit and central hub for communication with many of the various components of the system 1400, and may include power management circuitry as described herein. As one example, processor 1410 is implemented as a SoC.

Processor 1410, in one embodiment, communicates with a system memory 1415. As an illustrative example, the system memory 1415 is implemented via multiple memory devices or modules to provide for a given amount of system memory.

To provide for persistent storage of information such as data, applications, one or more operating systems and so forth, a mass storage 1420 may also couple to processor 1410. In various embodiments, to enable a thinner and lighter system design as well as to improve system responsiveness, this mass storage may be implemented via a SSD or the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 14, a flash device 1422 may be coupled to processor 1410, e.g., via a serial peripheral interface (SPI). This flash device may provide for non-volatile storage of system software, including a basic input/output software (BIOS) as well as other firmware of the system.

Various input/output (I/O) devices may be present within system 1400. Specifically shown in the embodiment of FIG. 14 is a display 1424 which may be a high definition LCD or LED panel that further provides for a touch screen 1425. In one embodiment, display 1424 may be coupled to processor 1410 via a display interconnect that can be implemented as a high performance graphics interconnect. Touch screen 1425 may be coupled to processor 1410 via another interconnect, which in an embodiment can be an I$^2$C interconnect. As further shown in FIG. 14, in addition to touch screen 1425, user input by way of touch can also occur via a touch pad 1430 which may be configured within the chassis and may also be coupled to the same I$^2$C interconnect as touch screen 1425.

For perceptual computing and other purposes, various sensors may be present within the system and may be coupled to processor 1410 in different manners. Certain inertial and environmental sensors may couple to processor 1410 through a sensor hub 1440, e.g., via an I$^2$C interconnect. In the embodiment shown in FIG. 14, these sensors may include an accelerometer 1441, an ambient light sensor (ALS) 1442, a compass 1443 and a gyroscope 1444. Other environmental sensors may include one or more thermal sensors 1446 which in some embodiments couple to processor 1410 via a system management bus (SMBus) bus.

As also seen in FIG. 14, various peripheral devices may couple to processor 1410 via a low pin count (LPC) interconnect. In the embodiment shown, various components can be coupled through an embedded controller 1435. Such components can include a keyboard 1436 (e.g., coupled via a PS2 interface), a fan 1437, and a thermal sensor 1439. In some embodiments, touch pad 1430 may also couple to EC 1435 via a PS2 interface. In addition, a security processor such as a trusted platform module (TPM) 1438 may also couple to processor 1410 via this LPC interconnect.

System 1400 can communicate with external devices in a variety of manners, including wirelessly. In the embodiment shown in FIG. 14, various wireless modules, each of which can correspond to a radio configured for a particular wireless communication protocol, are present. One manner for wireless communication in a short range such as a near field may be via a NFC unit 1445 which may communicate, in one embodiment with processor 1410 via an SMBus. Note that via this NFC unit 1445, devices in close proximity to each other can communicate.

As further seen in FIG. 14, additional wireless units can include other short range wireless engines including a WLAN unit 1450 and a Bluetooth™ unit 1452. Using WLAN unit 1450, Wi-Fi™ communications can be realized, while via Bluetooth™ unit 1452, short range Bluetooth™ communications can occur. These units may communicate with processor 1410 via a given link.

In addition, wireless wide area communications, e.g., according to a cellular or other wireless wide area protocol, can occur via a WWAN unit 1456 which in turn may couple to a subscriber identity module (SIM) 1457. In addition, to enable receipt and use of location information, a GPS module 1455 may also be present. Note that in the embodiment shown in FIG. 14, WWAN unit 1456 and an integrated capture device such as a camera module 1454 may communicate via a given link.

To provide for audio inputs and outputs, an audio processor can be implemented via a digital signal processor (DSP) 1460, which may couple to processor 1410 via a high definition audio (HDA) link. Similarly, DSP 1460 may communicate with an integrated coder/decoder (CODEC) and amplifier 1462 that in turn may couple to output speakers 1463 which may be implemented within the chassis. Similarly, amplifier and CODEC 1462 can be coupled to receive audio inputs from a microphone 1465 which in an embodiment can be implemented via dual array microphones (such as a digital microphone array) to provide for high quality audio inputs to enable voice-activated control of various operations within the system. Note also that audio outputs can be provided from amplifier/CODEC 1462 to a headphone jack 1464. Although shown with these particular components in the embodiment of FIG. 14, understand the scope of the present invention is not limited in this regard.

Although not shown in FIG. 14, in some embodiments, the system 1400 may include all or part of the reconfiguration logic described below with reference to FIGS. 17-20.

Figure 15:
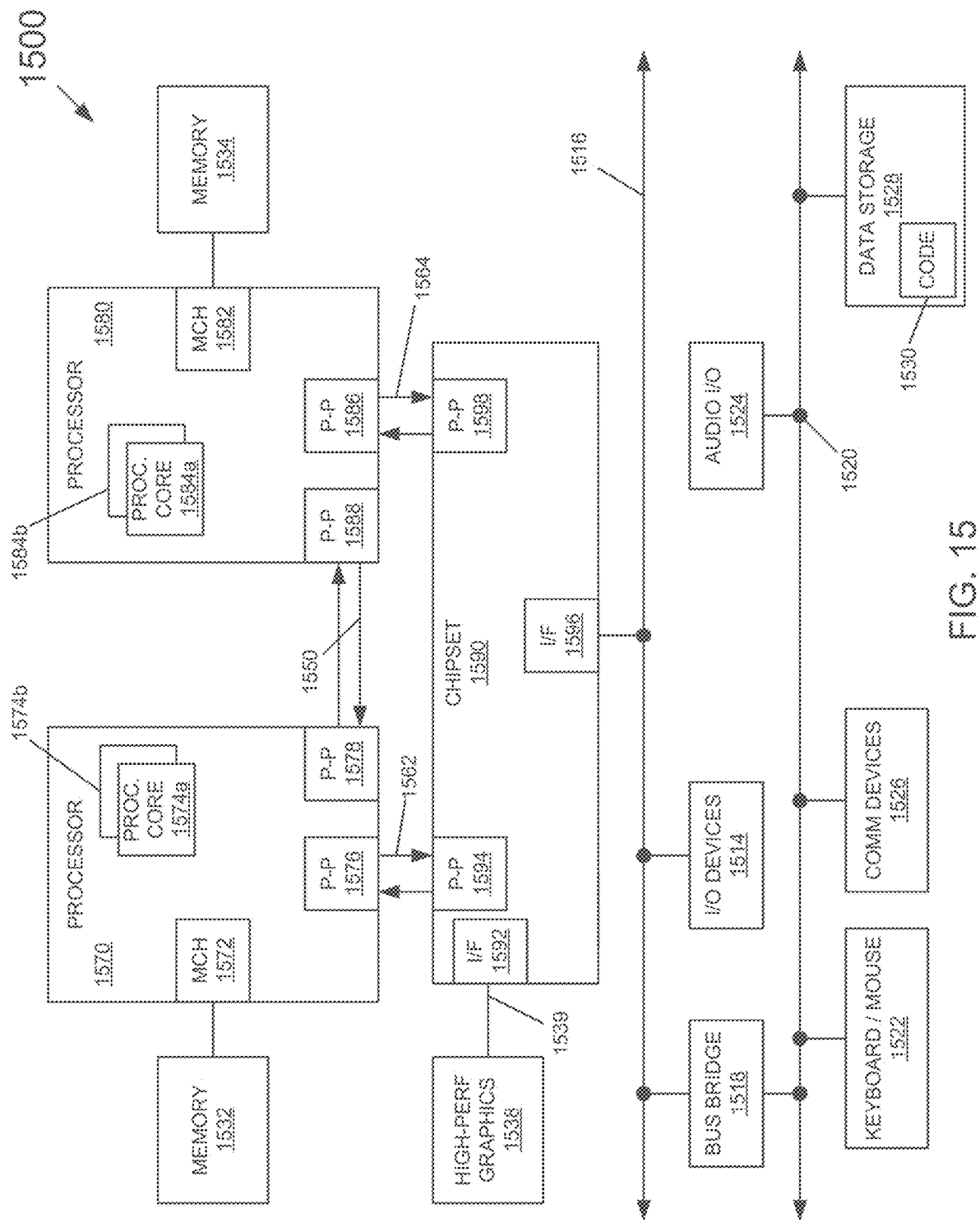
FIG. 15 is a block diagram of a system in accordance with an embodiment of the present invention.

Embodiments may be implemented in many different system types. Referring now to FIG. 15, shown is a block diagram of a system in accordance with an embodiment of the present invention. As shown in FIG. 15, multiprocessor system 1500 is a point-to-point interconnect system, and includes a first processor 1570 and a second processor 1580 coupled via a point-to-point interconnect 1550. As shown in FIG. 15, each of processors 1570 and 1580 may be multicore processors, including first and second processor cores (i.e., processor cores 1574a and 1574b and processor cores 1584a and 1584b), although potentially many more cores may be present in the processors. Each of the processors can include a PCU or other power management logic to perform processor-based power management as described herein.

Still referring to FIG. 15, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 15, MCH's 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chipset 1590 via P-P interconnects 1562 and 1564, respectively. As shown in FIG. 15, chipset 1590 includes P-P interfaces 1594 and 1598.

Furthermore, chipset 1590 includes an interface 1592 to couple chipset 1590 with a high-performance graphics engine 1538, by a P-P interconnect 1539. In turn, chipset 1590 may be coupled to a first bus 1516 via an interface 1596. As shown in FIG. 15, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520. Embodiments can be incorporated into other types of systems including mobile devices such as a smart cellular telephone, tablet computer, netbook, Ultrabook™, or so forth.

Although not shown in FIG. 15, in some embodiments, the system 1500 may include all or part of the reconfiguration logic described below with reference to FIGS. 17-20.

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 16:
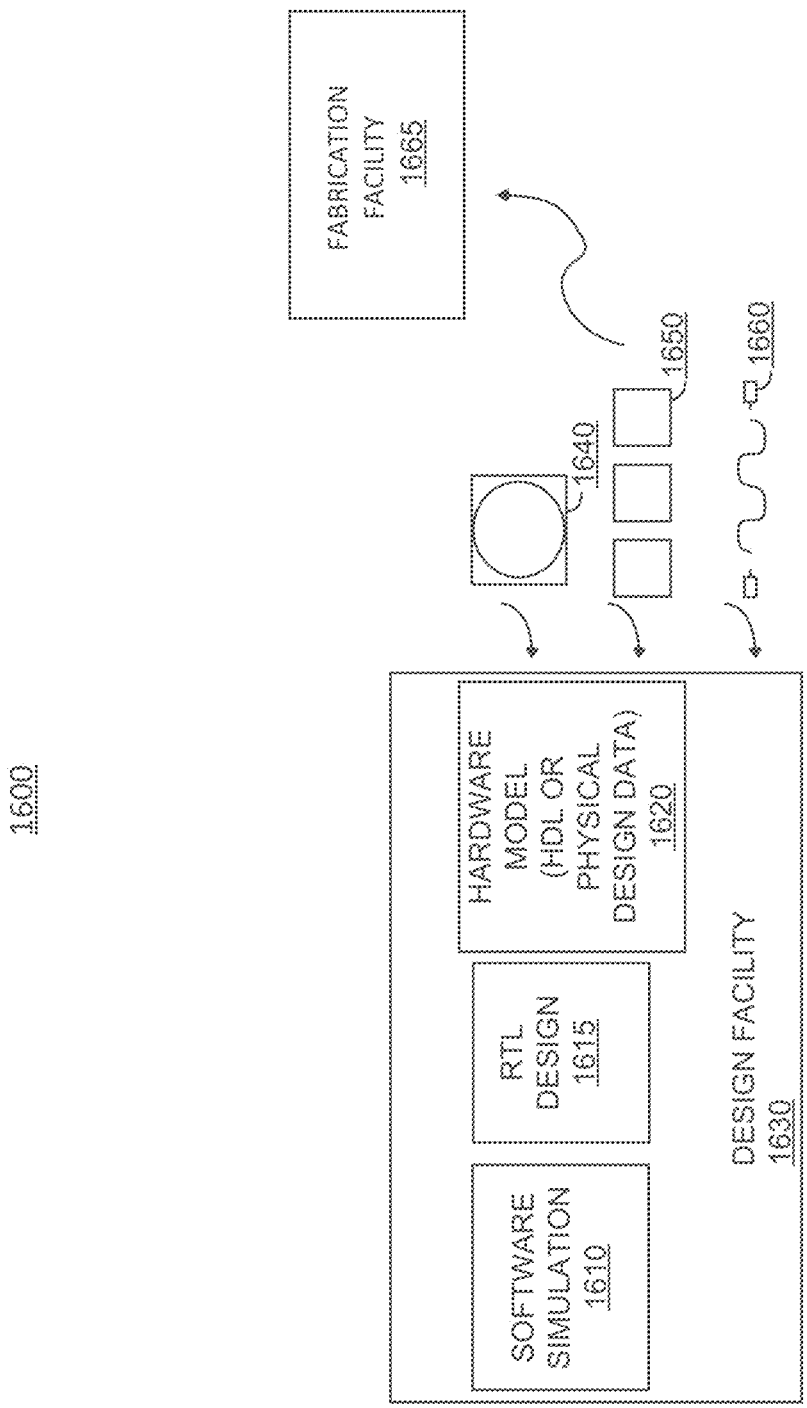
FIG. 16 is a block diagram illustrating an IP core development system used to manufacture an integrated circuit to perform operations according to an embodiment.

FIG. 16 is a block diagram illustrating an IP core development system 1600 that may be used to manufacture an integrated circuit to perform operations according to an embodiment. The IP core development system 1600 may be used to generate modular, re-usable designs that can be incorporated into a larger design or used to construct an entire integrated circuit (e.g., an SoC integrated circuit). A design facility 1630 can generate a software simulation 1610 of an IP core design in a high-level programming language (e.g., C/C++). The software simulation 1610 can be used to design, test, and verify the behavior of the IP core. A register transfer level (RTL) design can then be created or synthesized from the simulation model. The RTL design 1615 is an abstraction of the behavior of the integrated circuit that models the flow of digital signals between hardware registers, including the associated logic performed using the modeled digital signals. In addition to an RTL design 1615, lower-level designs at the logic level or transistor level may also be created, designed, or synthesized. Thus, the particular details of the initial design and simulation may vary.

The RTL design 1615 or equivalent may be further synthesized by the design facility into a hardware model 1620, which may be in a hardware description language (HDL), or some other representation of physical design data. The HDL may be further simulated or tested to verify the IP core design. The IP core design can be stored for delivery to a third-party fabrication facility 1665 using non-volatile memory 1640 (e.g., hard disk, flash memory, or any non-volatile storage medium). Alternately, the IP core design may be transmitted (e.g., via the Internet) over a wired connection 1650 or wireless connection 1660. The fabrication facility 1665 may then fabricate an integrated circuit that is based at least in part on the IP core design. The fabricated integrated circuit can be configured to perform operations in accordance with the reconfiguration logic described below with reference to FIGS. 17-20.

Figure 17:
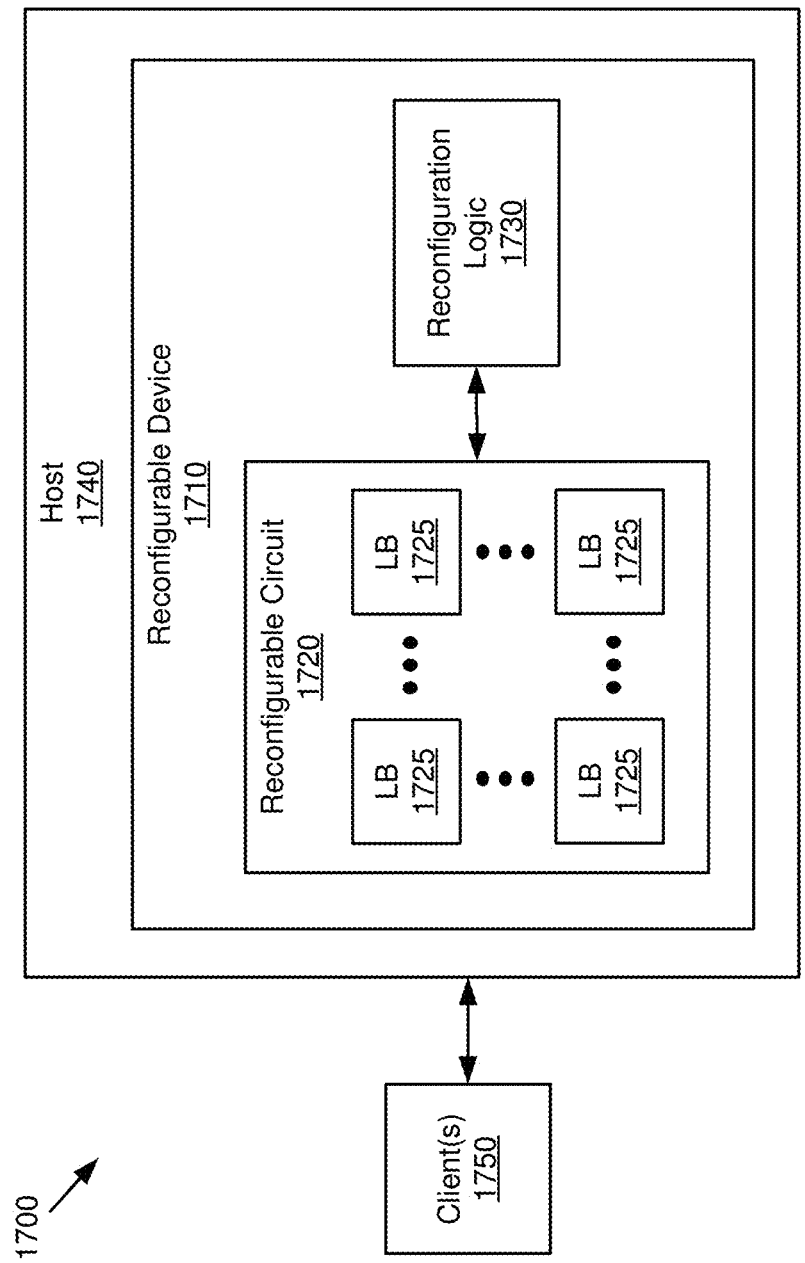
FIG. 17 is a diagram of an example system in accordance with one or more embodiments.

Referring now to FIG. 17, shown is a block diagram of a system 1700 in accordance with one or more embodiments. As shown, the system 1700 may include a host 1740 and any number of clients 1750. In some embodiments, the host 1740 may provide computing resources to a user of a client 1750. For example, the host 1740 may be a server included in a datacenter providing cloud computing services. Further, the clients 1750 may include any type of hardware and/or software clients, such as computing devices, software applications, virtual machines, containers, servers, smartphones, processors, embedded controllers, and so forth.

In one or more embodiments, the host 1740 may include a reconfigurable device 1710. For example, the reconfigurable device 1710 may be an expansion card, a processor, an integrated circuit, a device embedded within a processor, a device included in a System on a Chip (SoC), and so forth. Further, although not shown in FIG. 17, the host 1740 may include other components (e.g., memory, storage device, network interface, and so forth). In some embodiments, the reconfigurable device 1710 may include a reconfigurable circuit 1720 and reconfiguration logic 1730. The reconfigurable circuit 1720 may include a set of interconnected logical blocks (LBs) 1725. In some embodiments, the LBs 1725 and/or the interconnections in the reconfigurable circuit 1720 are configured according to a data image specifying a reconfiguration (referred to herein as a "reconfiguration image"). For example, the client 1750 may send a reconfiguration image to reconfigure the reconfigurable circuit 1720. In some embodiments, the reconfigurable circuit 1720 may be an FPGA.

In one or more embodiments, the reconfiguration logic 1730 may control the reconfiguration of the reconfigurable circuit 1720. For example, the reconfiguration logic 1730 may validate that a user entity is authorized to reconfigure the reconfigurable circuit 1720. A user entity may include a person, an application, a role, an organization, and so forth. Further, the reconfiguration logic 1730 may validate an image before it can be used to reconfigure the reconfigurable circuit 1720. In some embodiments, the reconfiguration logic 1730 may control the configuration of the LBs 1725 and associated interconnections using a validated reconfiguration image. The validation of user entities and/or reconfiguration images is described further below with reference to FIGS. 18-20.

In some embodiments, the reconfiguration logic 1730 may provide virtualized reconfiguration of the reconfigurable device 1710. For example, the reconfiguration logic 1730 may provide a layer of abstraction between the reconfigurable device 1710 and multiple user entities (e.g., user entities associated with two different organizations). Further, the reconfiguration logic 1730 may provide each user entity with an independent logical view of the reconfigurable device 1710. Accordingly, multiple user entities can separately and securely reconfigure the same reconfigurable device 1710, without interfering with or affecting each other.

Figure 18A:
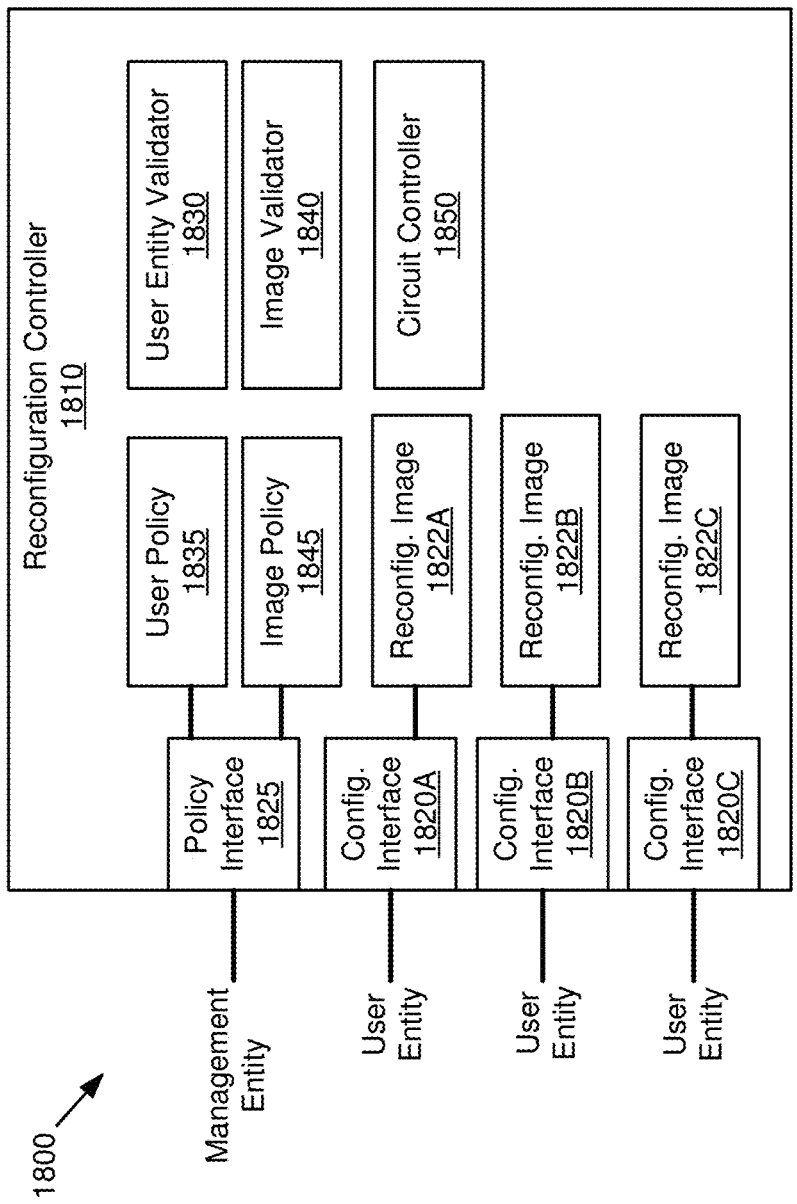
FIG. 18A is a diagram of an example reconfiguration logic in accordance with one or more embodiments.

Referring now to FIG. 18A, shown is an example reconfiguration logic 1800 in accordance with one or more embodiments. The reconfiguration logic 1800 may correspond generally to an example embodiment of some or all of the reconfiguration logic 1730 shown in FIG. 17. As such, the reconfiguration logic 1800 may be associated with a particular reconfigurable device (e.g., reconfigurable device 1710 shown in FIG. 17). As shown in FIG. 18A, the reconfiguration logic 1800 may include a reconfiguration controller 1810. In some embodiments, the reconfiguration controller 1810 may be a hardware device, and may be able to execute machine-readable instructions (e.g., software and/or firmware).

In one or more embodiments, the reconfiguration controller 1810 may include a policy interface 1825 and a set of configuration interfaces 1820A-1820C (also referred to generally as configuration interfaces 1820). The interfaces 1825 and 1820 may be implemented in hardware (e.g., network interfaces, local bus interfaces, memory registers, etc.). These interfaces can use various protocols such as Ethernet, Peripheral Component Interconnect (PCI), PCI Express (PCIe) physical functions, PCIe virtual functions and so forth.

In one or more embodiments, the configuration interfaces 1820A-1820C may receive various reconfiguration images 1822A-1822C. In some embodiments, each configuration interface 1820 may be uniquely associated with a particular user entity. For example, the configuration interface 1820A may be reserved for use by a first user entity, the configuration interface 1820B may be reserved for use by a second user entity, and so forth. In some embodiments, each configuration interface 1820 may be validated for receiving reconfiguration images (e.g., authorized to modify portion(s) of the reconfigurable circuit 1720 shown in FIG. 17).

In one or more embodiments, the policy interface 1825 may communicate policy information regarding reconfiguration of the reconfigurable device associated with the reconfiguration controller 1810. For example, a management entity (e.g., a system administrator using a client 1750 shown in FIG. 17) may use the policy interface 1825 to provide a user policy 1835 and/or an image policy 1845 for the reconfiguration controller 1810.

In some embodiments, a user policy 1835 may include information associated with user entities that are authorized to reconfigure the reconfigurable device. For example, a user policy 1835 may specify identities of authorized user entities, characteristics of authorized user entities (e.g., job titles, group membership, etc.), security and/or encryption information (digital keys/signatures, digital certificates, etc.), privileges and/or rights of each user entity, specific portions of a reconfigurable circuit (e.g., a particular set of LBs 1725 shown in FIG. 17) that a particular user entity is authorized to reconfigure, valid image types of each user entity, and so forth. Further, in some embodiments, a user policy 1835 may specify that a particular configuration interface is valid for receiving reconfiguration images, and/or is associated with an authorized user entity.

In some embodiments, an image policy 1845 may include information associated with valid images for reconfiguring the reconfigurable device. For example, an image policy 1845 may specify valid types of configurations, valid functions, valid portions of a reconfigurable circuit for reconfiguration, valid digital signatures of reconfiguration images, and so forth. In another example, an image policy 1845 may specify that a particular reconfiguration image can only be received at a particular configuration interface (e.g., reconfiguration image 1822A can only be received at configuration interface 1820A). In some embodiments, the received reconfiguration images 1822 may be encrypted in accordance to an image policy 1845. Further, in some embodiments, the reconfiguration controller 1810 may include a memory or storage medium (not shown in FIG. 18A) to store one or more user policies 1835, image policies 1845, and/or reconfiguration images 1822.

In one or more embodiments, the reconfiguration controller 1810 may include a user entity validator 1830, an image validator 1840, and a circuit controller 1850, each of which may be implemented in hardware, machine-readable instructions (e.g., software and/or firmware), or any combination thereof. In one or more embodiments, the user entity validator 1830 may validate configuration interfaces 1820 and/or user entities attempting to reconfigure a reconfigurable circuit. For example, the user entity validator 1830 may use a user policy 1835 to validate a configuration interface 1820 to receive a reconfiguration image 1822. In another example, the user entity validator 1830 may use a user policy 1835 to authorize a user entity to provide a reconfiguration image 1822. In some embodiments, the user entity validator 1830 may use a user policy 1835 to validate security and/or encryption information associated with a user entity (e.g., digital signatures, digital certificates, etc.), In one or more embodiments, the image validator 1840 may validate a reconfiguration image 1822 to be used for reconfiguring a reconfigurable circuit. In some embodiments, the image validator 1840 may use image policies 1845 to validate reconfiguration images 1822 for an associated reconfigurable circuit. For example, the image validator 1840 may use an image policy 1845 to determine whether a reconfiguration image 1822 includes a valid digital signature. In another example, the image validator 1840 may use an image policy 1845 to determine whether a reconfiguration image 1822 affects only authorized portions or functions of a reconfigurable circuit. In yet another example, the image validator 1840 may use an image policy 1845 to determine whether a reconfiguration image 1822 is similar or identical to images that are known to be harmful or malicious.

In one or more embodiments, the circuit controller 1850 may use a validated reconfiguration image 1822 to reconfigure a reconfigurable circuit (e.g., reconfigurable circuit 1720 shown in FIG. 17). For example, the circuit controller 1850 may modify a configuration of logical blocks and interconnections of a reconfigurable circuit as specified by the reconfiguration image 1822.

In some embodiments, the reconfiguration controller 1810 may process encrypted reconfiguration images 1822. For example, assume that a user entity (e.g., using a client 1750 shown in FIG. 17) may provide an encrypted reconfiguration image 1822 over a network. The user entity validator 1830 and/or the image validator 1840 may use the user policy 1835 and/or the image policy 1845 to decrypt the encrypted reconfiguration image 1822. The decrypted reconfiguration image 1822 may be validated by the image validator 1840, and may be used to reconfigure a reconfigurable circuit. In some embodiments, the reconfiguration images 1822 may be protected using any security features provided by the reconfigurable circuit platform (e.g., Fuse Keys, Total Memory Encryption, Software Guard Extensions, Remote Attestation, Inline Encryption/Decryption, and so forth).

In some embodiments, the reconfiguration controller 1810 may provide virtualized reconfiguration of a reconfigurable circuit. For example, assume that three different user entities are respectively associated with the configuration interfaces 1820A-1820C. In this example, a first user entity can provide a reconfiguration image 1822, without visibility of the reconfiguration images 1822 provided by the other user entities. Further, in some embodiments, each user entity may reconfigure a portion of the reconfigurable circuit that is reserved for that user entity. Accordingly, a user entity may be prevented from accessing or viewing the processing activities of other user entities. Therefore, multiple user entities can separately and securely reconfigure the same reconfigurable device, without interfering and/or affecting each other.

Figure 18B:
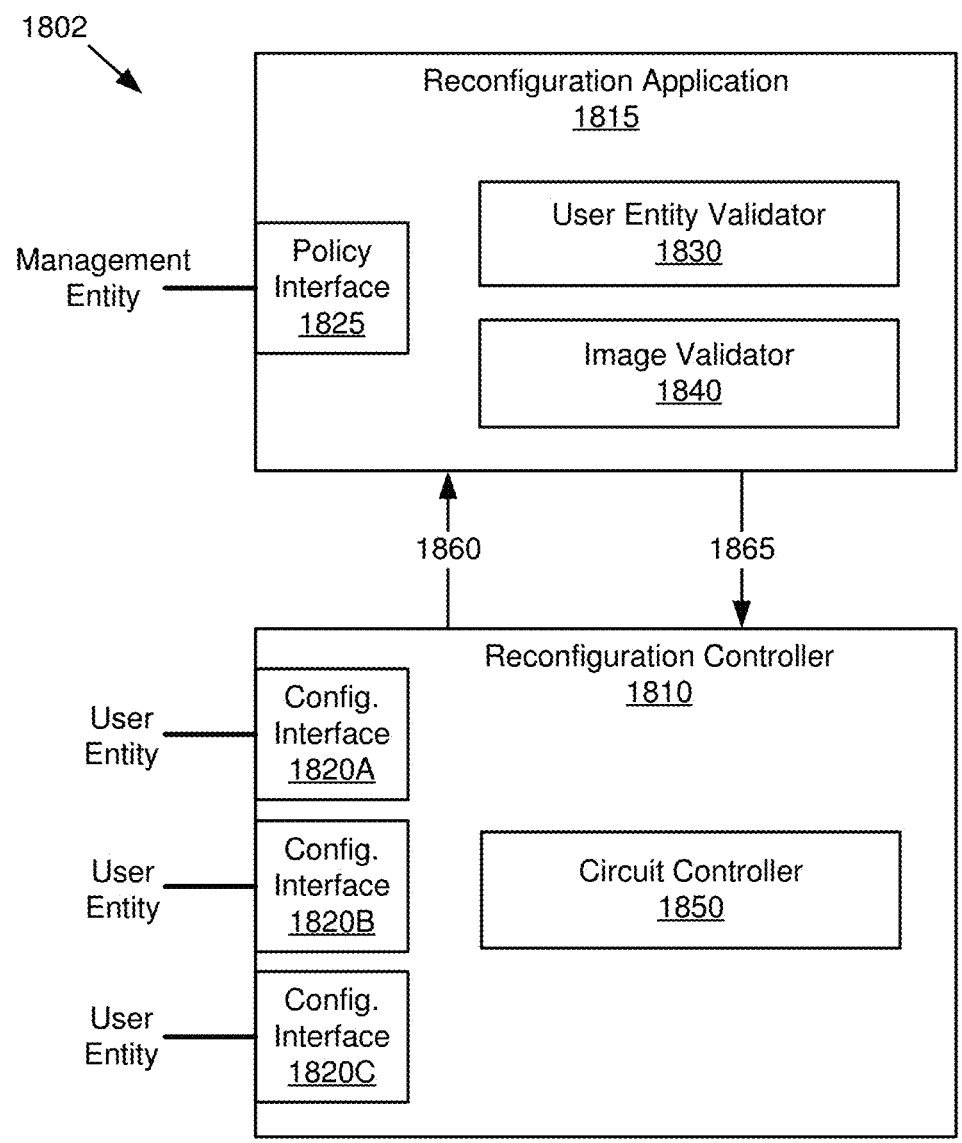
FIG. 18B is a diagram of an example reconfiguration logic in accordance with one or more embodiments.

Referring now to FIG. 18B, shown is an example reconfiguration logic 1802 in accordance with one or more embodiments. The reconfiguration logic 1802 may be an alternative embodiment of the reconfiguration logic 1800 shown in FIG. 18A. Assume that the components of reconfiguration logic 1802 are substantially equivalent to the components of the reconfiguration logic 1800 with the same labels.

As shown in FIG. 18B, the reconfiguration logic 1802 may include a reconfiguration application 1815 and a reconfiguration controller 1810. The reconfiguration application 1815 may be implemented in software (e.g., machine-readable instructions executed by a general-purpose processor (not shown in FIG. 18B)). Further, the reconfiguration controller 1810 may be implemented in hardware (e.g., as a hardware controller).

As shown in FIG. 18B, the reconfiguration application 1815 may include the policy interface 1825, the user entity validator 1830, and the image validator 1840. Further, the reconfiguration controller 1810 may include the circuit controller 1850 and the configuration interfaces 1820. In the example embodiment of FIG. 18B, the reconfiguration controller 1810 may transmit, to the reconfiguration application 1815, a message 1860 indicating that a reconfiguration image has been received via a particular configuration interface 1820. In some embodiments, the reconfiguration application 1815 may validate the particular configuration interface 1820 (e.g., by the user entity validator 1830 using a user policy 1835) and the received reconfiguration image (e.g., by the image validator 1840 using an image policy 1845). If the configuration interface 1820 and the received reconfiguration image are validated, the reconfiguration application 1815 may transmit, to the reconfiguration controller 1810, a message 1865 indicating that the received reconfiguration image can be used to reconfigure a reconfigurable circuit. In response to the message 1865, the circuit controller 1850 may modify the reconfigurable circuit according to the received reconfiguration image.

Figure 18C:
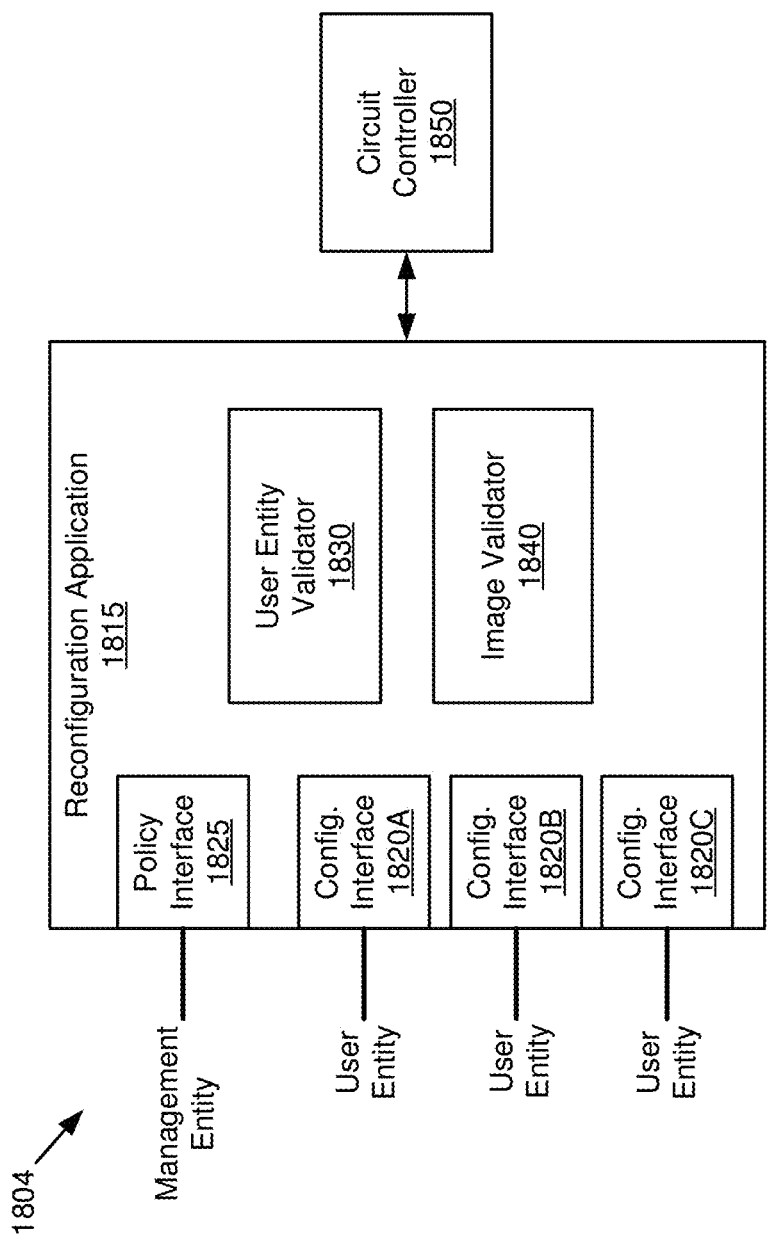
FIG. 18C is a diagram of an example reconfiguration logic in accordance with one or more embodiments.

Referring now to FIG. 18C, shown is an example reconfiguration logic 1804 in accordance with one or more embodiments. The reconfiguration logic 1804 may be an alternative embodiment of the reconfiguration logic 1800 (shown in FIG. 18A) and/or the reconfiguration logic 1802 (shown in FIG. 18B). Assume that the components of reconfiguration logic 1804 are substantially equivalent to the components of the reconfiguration logic 1800 and/or the reconfiguration logic 1802 with the same labels.

As shown in FIG. 18C, the reconfiguration logic 1804 may include a reconfiguration application 1815 and a circuit controller 1850. The reconfiguration application 1815 may be implemented in software, and the circuit controller 1850 may be implemented in hardware.

In the example embodiment of FIG. 18C, the reconfiguration application 1815 may include the policy interface 1825, the configuration interfaces 1820, the user entity validator 1830, and the image validator 1840. The reconfiguration application 1815 may receive a reconfiguration image via a particular configuration interface 1820, may validate the particular configuration interface 1820 (e.g., by the user entity validator 1830 using a user policy 1835) and the received reconfiguration image (e.g., by the image validator 1840 using an image policy 1845). If the configuration interface 1820 and the received reconfiguration image are validated, the reconfiguration application 1815 may transmit the reconfiguration image to the circuit controller 1850. The circuit controller 1850 may reconfigure the reconfigurable circuit based on the reconfiguration image.

Figure 18D:
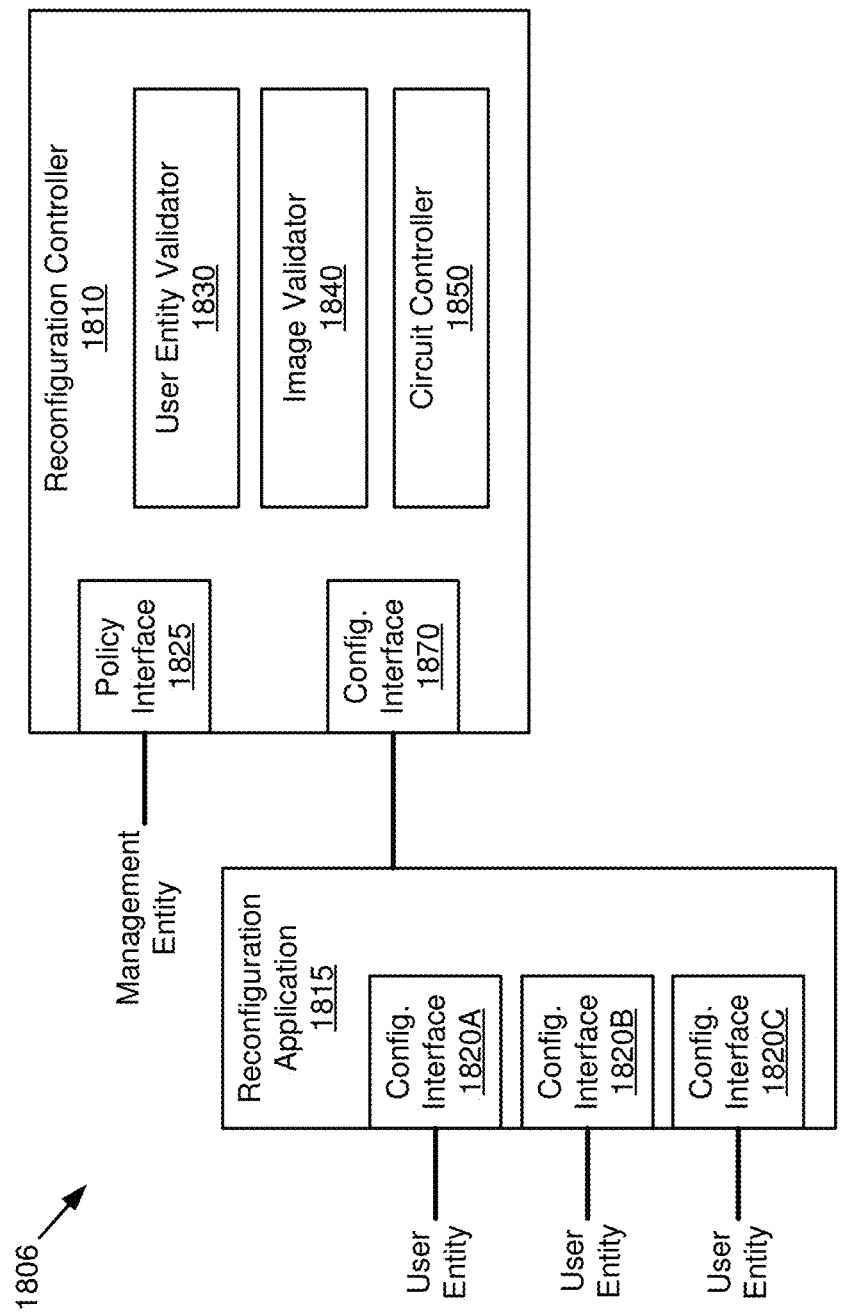
FIG. 18D is a diagram of an example reconfiguration logic in accordance with one or more embodiments.

Referring now to FIG. 18D, shown is an example reconfiguration logic 1806 in accordance with one or more embodiments. The reconfiguration logic 1806 may be an alternative embodiment of the reconfiguration logic 1800 (shown in FIG. 18A), the reconfiguration logic 1802 (shown in FIG. 18B), and/or the reconfiguration logic 1804 (shown in FIG. 18C). Assume that the components of reconfiguration logic 1806 are substantially equivalent to the components of the reconfiguration logic 1800, the reconfiguration logic 1802, and/or the reconfiguration logic 1804 with the same labels.

As shown in FIG. 18D, the reconfiguration logic 1806 may include a reconfiguration application 1815 and a reconfiguration controller 1810. The reconfiguration application 1815 may be implemented in software, and the reconfiguration controller 1810 may be implemented in hardware.

In the example embodiment of FIG. 18D, the reconfiguration application 1815 may include the configuration interfaces 1820. Further, the reconfiguration controller 1810 may include the user entity validator 1830, the image validator 1840, the circuit controller 1850, the policy interface 1825, and a configuration interface 1870.

The reconfiguration application 1815 may receive a reconfiguration image via a particular configuration interface 1820, and may transmit the received reconfiguration image to the reconfiguration controller 1810 via the configuration interface 1870. The reconfiguration controller 1810 may validate the particular configuration interface 1820 (e.g., by the user entity validator 1830 using a user policy 1835) and the received reconfiguration image (e.g., by the image validator 1840 using an image policy 1845). If the configuration interface 1820 and the received reconfiguration image are validated, the circuit controller 1850 may reconfigure the reconfigurable circuit based on the reconfiguration image.

Figure 19:
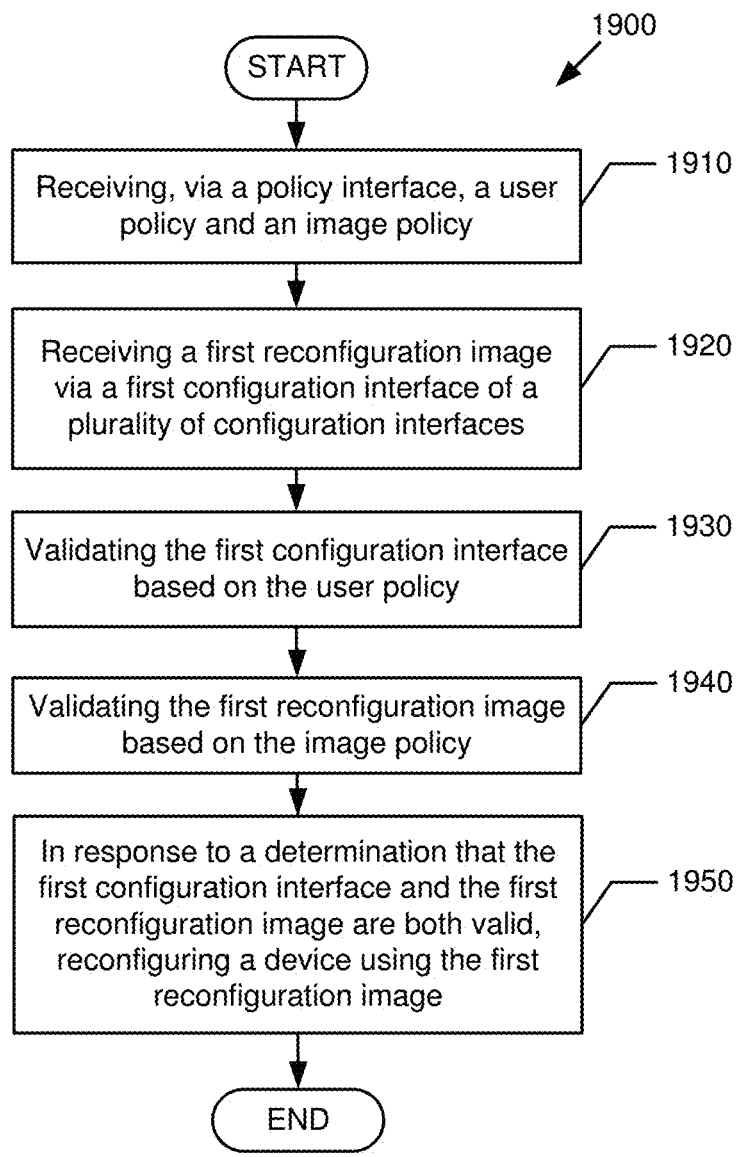
FIG. 19 is a flow diagram of an example method in accordance with one or more embodiments.

Referring now to FIG. 19, shown is a flow diagram of a method 1900 for data selection in accordance with one or more embodiments. In various embodiments, the method 1900 may be performed by processing logic that may include hardware (e.g., processing device, circuitry, dedicated logic, programmable logic, microcode, etc.), software (e.g., instructions run on a processing device), or a combination thereof. In some implementations, the method 1900 may be performed using one or more components shown in FIGS. 17-18D (e.g., reconfiguration logics 1730, 1800, 1802, 1804, 1806). In firmware or software embodiments, the method 1900 may be implemented by computer executed instructions stored in a non-transitory machine readable medium, such as an optical, semiconductor, or magnetic storage device. The machine-readable medium may store data, which if used by at least one machine, causes the at least one machine to fabricate at least one integrated circuit to perform a method. For the sake of illustration, the actions involved in the method 1900 may be described below with reference to FIGS. 17-18D, which show examples in accordance with one or more embodiments. However, the scope of the various embodiments discussed herein is not limited in this regard.

Block 1910 may include receiving, via a policy interface, a user policy and an image policy. For example, referring to FIG. 18A, the reconfiguration controller 1810 may receive a user policy 1835 and an image policy 1845 via the policy interface 1825. In some embodiments, the user policy 1835 and the image policy 1845 may be received from a management entity (e.g., an administrator using a client 1750 shown in FIG. 17).

Block 1920 may include receiving a first reconfiguration image via a first configuration interface of a plurality of configuration interfaces. For example, referring to FIG. 18A, the reconfiguration controller 1810 may receive the reconfiguration image 1822A via the configuration interface 1820A. In some embodiments, the configuration interface 1820A may be uniquely associated with a first user entity.

Block 1930 may include validating the first configuration interface based on the user policy. For example, referring to FIG. 18A, the user entity validator 1830 may validate the configuration interface 1820A using the user policy 1835. In some embodiments, validating the configuration interface 1820A may include determining that an associated user entity is authorized to provide the reconfiguration image 1822A.

Block 1940 may include validating the first reconfiguration image based on the image policy. For example, referring to FIG. 18A, the image validator 1840 may validate the reconfiguration image 1822A using the image policy 1845. In some embodiments, validating the reconfiguration image 1822A may include determining whether the reconfiguration image 1822A includes a valid digital signature, affects only authorized reconfigurable circuit portions, is similar to reconfiguration images that are known to be malicious, and so forth.

Block 1950 may include, in response to a determination that the first configuration interface and the first reconfiguration image are both valid, reconfiguring the reconfigurable circuit using the first reconfiguration image. For example, referring to FIG. 18A, the circuit controller 1850 may reconfigure logical blocks and interconnections of the reconfigurable circuit based on the validated reconfiguration image 1822A. After block 1950, the method 1900 is completed.

Figure 20:
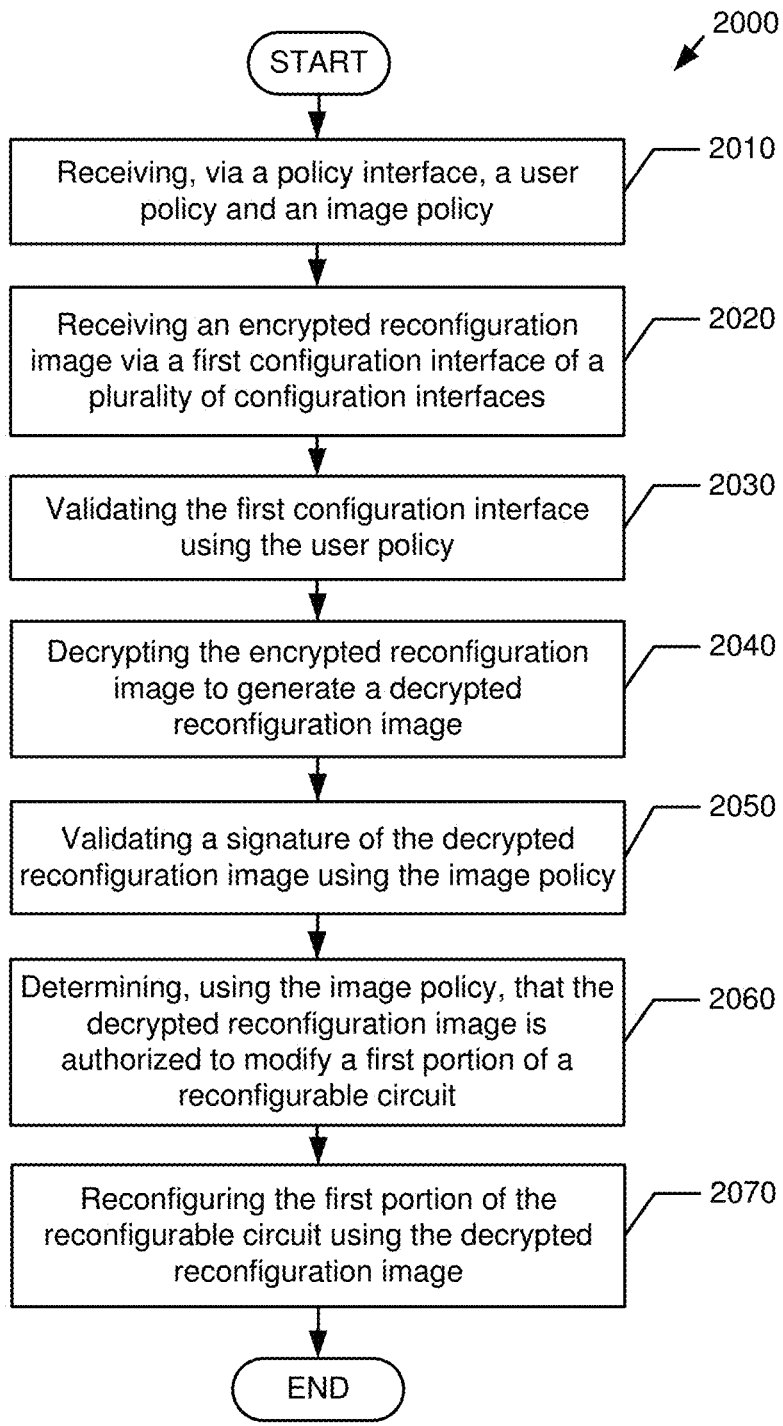
FIG. 20 is a flow diagram of an example method in accordance with one or more embodiments.

Referring now to FIG. 20, shown is a flow diagram of a method 2000 for data selection in accordance with one or more embodiments. In various embodiments, the method 1900 may be performed by processing logic that may include hardware (e.g., processing device, circuitry, dedicated logic, programmable logic, microcode, etc.), software (e.g., instructions run on a processing device), or a combination thereof. In some implementations, the method 2000 may be performed using one or more components shown in FIGS. 17-18D (e.g., reconfiguration logics 1730, 1800, 1802, 1804, 1806). In firmware or software embodiments, the method 2000 may be implemented by computer executed instructions stored in a non-transitory machine readable medium, such as an optical, semiconductor, or magnetic storage device. The machine-readable medium may store data, which if used by at least one machine, causes the at least one machine to fabricate at least one integrated circuit to perform a method. For the sake of illustration, the actions involved in the method 2000 may be described below with reference to FIGS. 17-18D, which show examples in accordance with one or more embodiments. However, the scope of the various embodiments discussed herein is not limited in this regard.

Block 2010 may include receiving, via a policy interface, a user policy and an image policy. For example, referring to FIG. 18A, the reconfiguration controller 1810 may receive a user policy 1835 and an image policy 1845 via the policy interface 1825.

Block 2020 may include receiving an encrypted reconfiguration image via a first configuration interface of a plurality of configuration interfaces. For example, referring to FIG. 18A, the reconfiguration controller 1810 may receive an encrypted reconfiguration image 1822A via the configuration interface 1820A. In some embodiments, the reconfiguration image 1822A may be encrypted to provide privacy and/or security for the user entity of the configuration interface 1820A.

Block 2030 may include validating the first configuration interface based on the user policy. For example, referring to FIG. 18A, the user entity validator 1830 may validate the configuration interface 1820A using the user policy 1835.

Block 2040 may include decrypting the encrypted reconfiguration image to generate a decrypted reconfiguration image. For example, referring to FIG. 18A, the image validator 1840 may decrypt the encrypted reconfiguration image 1822 based on the image policy 1845.

Block 2050 may include validating a signature of the decrypted reconfiguration image using the image policy. For example, referring to FIG. 18A, the image validator 1840 may use the image policy 1845 to determine that the decrypted reconfiguration image 1822A includes a valid digital signature.

Block 2060 may include determining, using the image policy, that the decrypted reconfiguration image is authorized to modify a first portion of a reconfigurable circuit. For example, referring to FIGS. 17 and 18A, the image validator 1840 may use the image policy 1845 to determine that the decrypted reconfiguration image 1822A modifies only an authorized portion of the reconfigurable circuit 1720 (e.g., a defined set of LBs 1725 and their interconnections).

Block 2070 may include reconfiguring the first portion of the reconfigurable circuit using the decrypted reconfiguration image. For example, referring to FIG. 18A, if the first configuration interface and the signature of the decrypted reconfiguration image are valid, and if the decrypted reconfiguration image is authorized to modify the first portion, the circuit controller 1850 may reconfigure the first portion of the reconfigurable circuit using the decrypted reconfiguration image 1822A. After block 2070, the method 2000 is completed.

Note that, while FIGS. 17-20 illustrate various example implementations, other variations are possible. It is contemplated that one or more embodiments may be implemented in the example devices and systems described below with reference to FIGS. 1-16.

Note that the examples shown in FIGS. 1-20 are provided for the sake of illustration, and are not intended to limit any embodiments. Specifically, while embodiments may be shown in simplified form for the sake of clarity, embodiments may include any number and/or arrangement of processors, cores, and/or additional components (e.g., buses, storage media, connectors, power components, buffers, interfaces, etc.). For example, it is contemplated that some embodiments may include any number of components in addition to those shown, and that different arrangement of the components shown may occur in certain implementations. Furthermore, it is contemplated that specifics in the examples shown in FIGS. 1-20 may be used anywhere in one or more embodiments.

Although some embodiments are described with reference to specific integrated circuits, such as in computing platforms or processors, other embodiments are applicable to other types of integrated circuits and logic devices. Similar techniques and teachings of embodiments described herein may be applied to other types of circuits or semiconductor devices. For example, the disclosed embodiments are not limited to any particular type of computer systems. That is, disclosed embodiments can be used in many different system types, ranging from server computers (e.g., tower, rack, blade, micro-server and so forth), communications systems, storage systems, desktop computers of any configuration, laptop, notebook, and tablet computers (including 2:1 tablets, phablets and so forth), and may be also used in other devices, such as handheld devices, systems on chip (SoCs), and embedded applications. Some examples of handheld devices include cellular phones such as smartphones, Internet protocol devices, digital cameras, personal digital assistants (PDAs), and handheld PCs. Embedded applications may typically include a microcontroller, a digital signal processor (DSP), network computers (NetPC), set-top boxes, network hubs, wide area network (WAN) switches, wearable devices, or any other system that can perform the functions and operations taught below. More so, embodiments may be implemented in mobile terminals having standard voice functionality such as mobile phones, smartphones and phablets, and/or in non-mobile terminals without a standard wireless voice function communication capability, such as many wearables, tablets, notebooks, desktops, micro-servers, servers and so forth. Moreover, the apparatuses, methods, and systems described herein are not limited to physical computing devices, but may also relate to software implementations.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments.

In Example 1, a reconfigurable device includes a reconfigurable circuit and reconfiguration logic. The reconfiguration logic is to: receive, via a policy interface, a user policy and an image policy; receive a first reconfiguration image via a first configuration interface of a plurality of configuration interfaces; validate the first configuration interface based on the user policy; validate the first reconfiguration image based on the image policy; and in response to a determination that the first configuration interface and the first reconfiguration image are both valid, reconfigure the reconfigurable circuit using the first reconfiguration image.

In Example 2, the subject matter of Example 1 may optionally include that reconfiguration logic comprises: a user entity validator to validate the first reconfiguration interface using the user policy; an image validator to validate the first reconfiguration image using the image policy; and a circuit controller to reconfigure the reconfigurable circuit using the first reconfiguration image.

In Example 3, the subject matter of Examples 1-2 may optionally include that the user entity validator, the image validator, and the circuit controller are implemented in a hardware controller.

In Example 4, the subject matter of Examples 1-3 may optionally include that the policy interface and the plurality of configuration interfaces are implemented in the hardware controller.

In Example 5, the subject matter of Examples 1-4 may optionally include that the user entity validator and the image validator are implemented in a software application; and the circuit controller is implemented in a hardware controller.

In Example 6, the subject matter of Examples 1-5 may optionally include that the policy interface is implemented in a software application; and the plurality of configuration interfaces are implemented in a hardware controller.

In Example 7, the subject matter of Examples 1-6 may optionally include that the user entity validator, the image validator, the policy interface, and the plurality of configuration interfaces are implemented in a software application; and the circuit controller is implemented in a hardware controller.

In Example 8, the subject matter of Examples 1-7 may optionally include that the plurality of configuration interfaces are implemented in a software application; and the user entity validator, the image validator, the circuit controller, and the policy interface are implemented in a hardware controller.

In Example 9, the subject matter of Examples 1-8 may optionally include that the reconfigurable circuit is a field-programmable gate array (FPGA).

In Example 10, the subject matter of Examples 1-9 may optionally include that the reconfiguration logic is to provide virtualized reconfiguration of the reconfigurable circuit.

In Example 11, a method for reconfiguring a circuit includes: receiving, via a policy interface, a user policy and an image policy associated with a reconfigurable circuit; receiving a reconfiguration image via a first configuration interface of a plurality of configuration interfaces; validating, by a user entity validator, the first reconfiguration interface using the user policy; validating, by an image validator, the reconfiguration image using the image policy; and reconfiguring, by a circuit controller, the reconfigurable circuit using the validated reconfiguration image.

In Example 12, the subject matter of Example 11 may optionally include that the received reconfiguration image is encrypted, and the method includes decrypting the encrypted reconfiguration image.

In Example 13, the subject matter of Examples 11-12 may optionally include validating a signature of the reconfiguration image using the image policy.

In Example 14, the subject matter of Examples 11-13 may optionally include that the user entity validator, the image validator, the circuit controller, the policy interface, and the plurality of configuration interfaces are implemented in a hardware controller.

In Example 15, the subject matter of Examples 11-14 may optionally include providing virtualized reconfiguration of the reconfigurable circuit via the plurality of configuration interfaces.

In Example 16, the subject matter of Examples 11-15 may optionally include that the reconfigurable circuit is a field-programmable gate array (FPGA).

In Example 17, a computing device for data selection includes: one or more processors; and a memory having stored therein a plurality of instructions that when executed by the one or more processors, cause the computing device to perform the method of any of Examples 11 to 16.

In Example 18, at least one machine-readable medium has stored thereon data which, if used by at least one machine, causes the at least one machine to perform the method of any of Examples 11 to 16.

In Example 19, an electronic device for data selection comprises means for performing the method of any of Examples 11 to 16.

In Example 20, a system for reconfiguring a circuit includes: a reconfigurable circuit; a policy interface to receive a user policy and an image policy; a plurality of configuration interfaces, including a first configuration interface to receive a reconfiguration image; a user entity validator to validate the first configuration interface based on the user policy; an image validator to validate the reconfiguration image based on the image policy; and a circuit controller to reconfigure the reconfigurable circuit using the validated reconfiguration image.

In Example 21, the subject matter of Example 20 may optionally include that the image validator is further to decrypt the reconfiguration image using the image policy.

In Example 22, the subject matter of Examples 20-21 may optionally include that the image validator is further to validate a signature of the reconfiguration image using the image policy.

In Example 23, the subject matter of Examples 20-22 may optionally include that the plurality of configuration interfaces are to provide a plurality of user entities with virtualized reconfiguration of the reconfigurable circuit.

In Example 24, the subject matter of Examples 20-23 may optionally include that the reconfigurable circuit, the user entity validator, the image validator, the circuit controller, the policy interface, and the plurality of configuration interfaces are included in a hardware processor.

In Example 25, the subject matter of Examples 20-24 may optionally include that the reconfigurable circuit is a field-programmable gate array (FPGA).

In Example 26, an apparatus for reconfiguring a circuit includes: means for receiving, via a policy interface, a user policy and an image policy associated with a reconfigurable circuit; means for receiving a reconfiguration image via a first configuration interface of a plurality of configuration interfaces; means for validating the first reconfiguration interface using the user policy; means for validating the reconfiguration image using the image policy; and means for reconfiguring the reconfigurable circuit using the validated reconfiguration image.

In Example 27, the subject matter of Example 26 may optionally include that the received reconfiguration image is encrypted, and the apparatus further includes means for decrypting the encrypted reconfiguration image.

In Example 28, the subject matter of Examples 26-27 may optionally include means for validating a signature of the reconfiguration image using the image policy.

In Example 29, the subject matter of Examples 26-28 may optionally include means for providing virtualized reconfiguration of the reconfigurable circuit via the plurality of configuration interfaces.

In Example 30, the subject matter of Examples 26-29 may optionally include that the reconfigurable circuit is a field-programmable gate array (FPGA).

It is contemplated that various combinations of the above examples are possible. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application. As used herein, "in response to" refers to a direct cause-and-effect relationship.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A reconfigurable device comprising:
   a reconfigurable circuit; and
   reconfiguration logic to:
      receive, via a policy interface, an image policy;
      receive a first reconfiguration image via a first configuration interface of a plurality of configuration interfaces;
      validate the first reconfiguration image based on the image policy; and
      in response to a determination that the first reconfiguration image is valid, reconfigure the reconfigurable circuit using the first reconfiguration image.

2. The reconfigurable device of claim 1, wherein the reconfiguration logic comprises:
   a user entity validator to validate the first reconfiguration interface using a user policy;
   an image validator to validate the first reconfiguration image using the image policy; and
   a circuit controller to reconfigure the reconfigurable circuit using the first reconfiguration image.

3. The reconfigurable device of claim 2, wherein the user entity validator, the image validator, and the circuit controller are implemented in a hardware controller, and wherein the user policy is received via the policy interface.

4. The reconfigurable device of claim 3, wherein the policy interface and the plurality of configuration interfaces are implemented in the hardware controller.

5. The reconfigurable device of claim 2, wherein:
   the user entity validator and the image validator are implemented in a software application; and
   the circuit controller is implemented in a hardware controller.

6. The reconfigurable device of claim 2, wherein:
   the policy interface is implemented in a software application; and
   the plurality of configuration interfaces are implemented in a hardware controller.

7. The reconfigurable device of claim 2, wherein:
   the user entity validator, the image validator, the policy interface, and the plurality of configuration interfaces are implemented in a software application; and
   the circuit controller is implemented in a hardware controller.

8. The reconfigurable device of claim 2, wherein:
   the plurality of configuration interfaces are implemented in a software application; and
   the user entity validator, the image validator, the circuit controller, and the policy interface are implemented in a hardware controller.

9. The reconfigurable device of claim 1, wherein the reconfigurable circuit is a field-programmable gate array (FPGA).

10. The reconfigurable device of claim 1, wherein the reconfiguration logic is to provide virtualized reconfiguration of the reconfigurable circuit.

11. A method comprising:
    receiving, via a policy interface, an image policy associated with a reconfigurable circuit;
    receiving a reconfiguration image via a first configuration interface of a plurality of configuration interfaces;
    validating, by an image validator, the reconfiguration image using the image policy; and
    reconfiguring, by a circuit controller, the reconfigurable circuit using the validated reconfiguration image.

12. The method of claim 11, wherein the received reconfiguration image is encrypted, and further comprising decrypting the encrypted reconfiguration image.

13. The method of claim 11, further comprising:
    validating a signature of the reconfiguration image using the image policy.

14. The method of claim 11, further comprising, prior to reconfiguring the reconfigurable circuit:
    validating, by a user entity validator, the first reconfiguration interface using a user policy, wherein the user entity validator, the image validator, the circuit controller, the policy interface, and the plurality of configuration interfaces are implemented in a hardware controller.

15. The method of claim 11, further comprising providing virtualized reconfiguration of the reconfigurable circuit via the plurality of configuration interfaces.

16. The method of claim 11, wherein the reconfigurable circuit is a field-programmable gate array (FPGA).

17. A system comprising:
    a reconfigurable circuit;
    a policy interface to receive an image policy;
    a plurality of configuration interfaces, including a first configuration interface to receive a reconfiguration image;
    an image validator to validate the reconfiguration image based on the image policy; and
    a circuit controller to reconfigure the reconfigurable circuit using the validated reconfiguration image.

18. The system of claim 17, the image validator further to decrypt the reconfiguration image using the image policy.

19. The system of claim 17, the image validator further to validate a signature of the reconfiguration image using the image policy.

20. The system of claim 17, wherein the plurality of configuration interfaces are to provide a plurality of user entities with virtualized reconfiguration of the reconfigurable circuit.

21. The system of claim 17, comprising a user entity validator to validate the first configuration interface based on a user policy, wherein the reconfigurable circuit, the user entity validator, the image validator, the circuit controller, the policy interface, and the plurality of configuration interfaces are included in a hardware processor.

22. The system of claim 17, wherein the reconfigurable circuit is a field-programmable gate array (FPGA).

* * * * *